(12) United States Patent
Oh et al.

(10) Patent No.: US 9,135,111 B2
(45) Date of Patent: Sep. 15, 2015

(54) NONVOLATILE MEMORY DEVICE AND BAD AREA MANAGING METHOD THEREOF

(75) Inventors: Eun Chu Oh, Gyeonggi-do (KR);
KyoungLae Cho, Gyeonggi-do (KR);
Mankeun Seo, Gyeonggi-do (KR);
Junjin Kong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 582 days.

(21) Appl. No.: 13/431,426

(22) Filed: Mar. 27, 2012

(65) Prior Publication Data

US 2012/0254680 A1 Oct. 4, 2012

(30) Foreign Application Priority Data

Mar. 28, 2011 (KR) .................. 10-2011-0027730

(51) Int. Cl.
*G11C 29/00* (2006.01)
*G06F 11/00* (2006.01)
*G11C 11/34* (2006.01)
*G11C 8/00* (2006.01)
*G06F 11/10* (2006.01)
*G11C 5/02* (2006.01)
(Continued)

(52) U.S. Cl.
CPC ........ *G06F 11/1068* (2013.01); *G06F 11/1016* (2013.01); *G06F 11/1044* (2013.01); *G06F 11/1048* (2013.01); *G06F 11/1072* (2013.01); *G11C 5/02* (2013.01); *G11C 5/025* (2013.01); *G11C 29/70* (2013.01); *G11C 29/82* (2013.01); *G11C 29/883* (2013.01); *H01L 27/0688* (2013.01); *H01L 27/11514* (2013.01); *H01L 27/11521* (2013.01); *H01L 27/11578* (2013.01); *H01L 27/281* (2013.01)

(58) Field of Classification Search
CPC ...... G11C 29/883; G11C 29/70; G11C 5/025; G11C 5/02; G06F 11/1068; G06F 11/1072; G06F 11/1044; G06F 11/1016; G06F 11/1048; H01L 27/0688; H01L 27/11514; H01L 27/11521; H01L 27/11578; H01L 27/281
USPC ......... 714/718, 723, 746, 763, 768, 769, 773, 714/799, 6.1, 48; 365/185.09, 200, 201, 365/230.03, 236; 711/101, 104, 105, 152, 711/170, 202
See application file for complete search history.

(56) References Cited

U.S. PATENT DOCUMENTS 6,584,595 B2 6/2003 Cypher
6,591,394 B2 * 7/2003 Lee et al. ...................... 714/766
(Continued)

FOREIGN PATENT DOCUMENTS

| JP | 2007058873 A | 3/2007 |
| JP | 2007140623 A | 6/2007 |
| JP | 2009110053 A | 5/2009 |

*Primary Examiner* — John J Tabone, Jr.
(74) *Attorney, Agent, or Firm* — Harness, Dickey & Pierce, P.L.C.

(57) ABSTRACT

Example embodiments relate to a bad area managing method of a nonvolatile memory device. The nonvolatile memory device may include a plurality of memory blocks and each block may contain memory layers stacked on a substrate. According to example embodiments, a method includes accessing one of the memory blocks, judging whether the accessed memory block includes at least one memory layer containing a bad memory cell. If a bad memory cell is detected, the method may further include configuring the memory device to treat the at least one memory layer of the accessed memory block as a bad area.

20 Claims, 25 Drawing Sheets

(51) Int. Cl.
*H01L 27/115* (2006.01)
*H01L 27/06* (2006.01)
*H01L 27/28* (2006.01)

(56) References Cited

U.S. PATENT DOCUMENTS

| | | | | |
|---|---|---|---|---|
| 7,219,271 B2* | 5/2007 | Kleveland et al. | ............ | 714/718 |
| 7,373,584 B2* | 5/2008 | Ito et al. | ........................ | 714/763 |
| 7,477,522 B2* | 1/2009 | Hazelzet | ........................ | 361/760 |
| 8,031,544 B2* | 10/2011 | Kim et al. | ..................... | 365/200 |
| 8,140,938 B2* | 3/2012 | Ito et al. | ........................ | 714/763 |
| 8,243,483 B2* | 8/2012 | Park | ................................ | 365/51 |
| 8,413,013 B2* | 4/2013 | Toda | ............................ | 714/763 |
| 8,427,872 B2* | 4/2013 | Kim | ........................ | 365/185.09 |
| 8,484,542 B2* | 7/2013 | d'Abreu et al. | ............... | 714/785 |
| 8,677,216 B2* | 3/2014 | Park et al. | ..................... | 714/764 |
| 2009/0083476 A1* | 3/2009 | Pua et al. | ..................... | 711/103 |
| 2011/0167319 A1* | 7/2011 | Jeddeloh | ...................... | 714/763 |
| 2011/0228581 A1* | 9/2011 | Park et al. | ........................ | 365/51 |
| 2013/0275832 A1* | 10/2013 | D'Abreu et al. | ............... | 714/764 |

* cited by examiner

Fig. 3
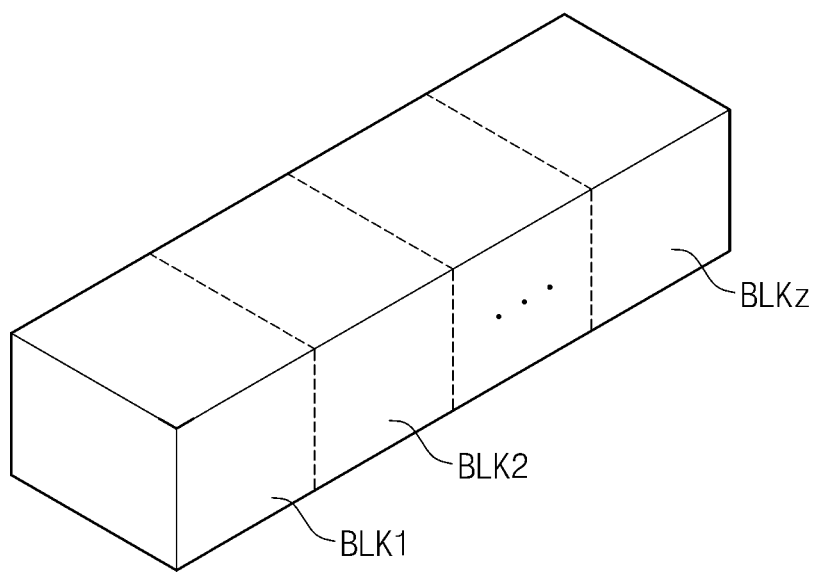
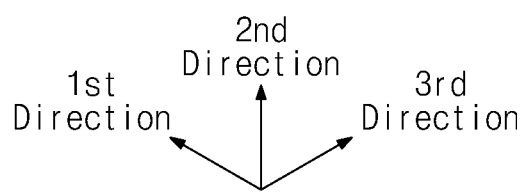

NONVOLATILE MEMORY DEVICE AND BAD AREA MANAGING METHOD THEREOF

CROSS-REFERENCE TO RELATED APPLICATIONS

This application claims foreign priority under 35 U.S.C. §119 to the benefit of Korean Patent Application No. 10-2011-0027730, filed Mar. 28, 2011, the entire disclosure of which is incorporated by reference herein.

BACKGROUND

Example embodiments relate to a nonvolatile memory device, and more particularly, relate to a bad area managing method of a nonvolatile memory device.

A semiconductor memory device may be fabricated using semiconductors such as silicon (Si), germanium (Ge), gallium arsenide (GaAs), indium phosphide (InP), and the like. Semiconductor memory devices may be classified as volatile memory devices and nonvolatile memory devices.

Volatile memory devices may lose stored contents when the power is off. Examples of volatile memory devices include static RAM (SRAM), dynamic RAM (DRAM), synchronous DRAM (SDRAM), and the like. Nonvolatile memory devices may retain stored contents even when their power is off. Nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), and the like. Flash memory devices include NOR type and NAND type flash memory.

Semiconductor memory devices with a three-dimensional array structure are being developed. Semiconductor memory devices, including semiconductor memory devices with a three-dimensional array structure, may include some bad memory cells.

SUMMARY

According to example embodiments of inventive concepts, a bad area managing method of a nonvolatile memory device relates to a nonvolatile memory device including a plurality of memory blocks, each memory block containing memory layers stacked on a substrate. The bad area managing method includes accessing of the memory blocks, judging whether the accessed memory block includes at least one memory layer containing a bad memory cell. If the bad memory cell is detected, the method may include configuring the memory device to treat the at least one memory layer of the accessed memory block as a bad area.

The configuring the memory device to treat the at least one memory layer of the accessed memory block as a bad area may include treating a memory layer between the at least one memory layer containing the bad memory cell and the substrate, together with the at least one memory layer containing the bad memory cell, as a bad area.

The configuring the memory device to treat the at least one memory layer of the accessed memory block as a bad area may include treating all memory layers between the at least one memory layer containing the bad memory cell and the substrate, together with the memory layer including the bad memory cell, as a bad area.

Each memory layer may include a plurality of memory cells. Each memory block may include a semiconductor pillar that penetrates the memory layers of the memory block. The semiconductor pillar of each memory block may define channels of the plurality of memory cells contained within the memory block.

The configuring the memory device to treat the at least one memory layer of the accessed memory block as a bad area may include treating another memory layer other than the at least one memory layer containing the bad memory cell, together with the at least one memory layer containing the bad memory cell as a bad area. The semiconductor pillar may include a first width that is wider than a second width of the semiconductor pillar. The first width may correspond to the at least one memory layer containing the bad memory cell, and the second width may correspond to the another memory layer.

The plurality of memory layers in each memory block may be divided into a plurality of sub-memory blocks. The configuring the memory device to treat the at least one memory layer of the accessed memory block as a bad area may include treating at least one sub-memory block of the accessed memory block as a bad area, where the at least one sub-memory block may contain the bad memory cell.

The configuring the memory device to treat the at least one memory layer of the accessed memory block as a bad area may include treating another sub-memory block other than the sub-memory block containing the bad memory cell, together with the sub-memory block containing the bad memory cell, as a bad area. The sub-memory block may include a semiconductor pillar that penetrates the memory layers of the sub-memory block. The semiconductor pillar may include a first width that is wider than a second width of the semiconductor pillar. The first width may correspond to the sub-memory block containing the bad memory cell. The second width may correspond to the another sub-memory block.

Each memory block may include a plurality of memory cells and a semiconductor pillar, the semiconductor pillar penetrating the memory layers of the memory block. The semiconductor pillar of each memory block may define channels of memory cells contained within the memory block. The semiconductor pillar may include first and second sub semiconductor pillars that are perpendicular to the substrate and the first sub semiconductor pillar penetrates the at least one memory layer including the bad memory cell. A first width of the first sub semiconductor pillar may be wider than a second width of the first sub semiconductor pillar. The first width may correspond to the at least one sub-memory layer including the bad memory cell and the second width may correspond to the at least one sub-memory layer. The configuring the memory device to treat the at least one memory layer of the accessed memory block as a bad area may include treating another memory layer penetrated by the first sub semiconductor pillar, together with the at least one memory layer containing the bad memory cell, as a bad area.

Each memory layer may include a plurality of memory cells. Each memory block may include a plurality of word lines connected to the plurality of memory layers contained within the memory block, respectively. At a program or read operation, memory cells connected with a selected word line may be accessed by applying a first voltage to the selected word line and applying a second voltage to unselected word lines, or by applying a first voltage to the selected word line, applying a second voltage to unselected word lines, and applying a third voltage to word lines connected with the bad area, the third voltage being higher in level than the second voltage.

According to example embodiments of inventive concepts, a nonvolatile memory device includes a nonvolatile memory portion including a plurality of memory blocks, and each of the plurality of memory blocks may contain memory layers stacked on a substrate. The device may further include a controller configured to manage at least one memory layer of an accessed one of the plurality of memory blocks as a bad area when the memory device detects a bad memory cell in the least one memory layer of the accessed memory block.

The controller may include an address management register configured to store bad area information about the bad area, and an address management circuit configured to update the bad area information such that the at least one memory layer including the bad memory cell is managed as the bad area.

The address management circuit may be configured to provide a physical address based upon the bad area information, the nonvolatile memory portion being accessed according to the physical address. At a program or read operation, the address management circuit may be configured to provide the physical address by a page unit when the memory block including the bad area is selected and by a memory block unit when a memory block not including the bad area is selected.

Memory layers included in each memory block may be divided into a plurality of sub-memory blocks stacked on the substrate, and the controller may include an address management register configured to store bad area about the bad area, and an address management circuit configured to update the bad area information such that the at least one sub-memory block including the bad memory cell is managed as the bad area.

The address management circuit may be configured to provide a physical address based upon the bad area information. The nonvolatile memory portion may be configured to be accessed according to the physical address. At a program or read operation, the address management circuit may be configured to provide the physical address by a sub-memory block unit when a memory block including the bad area is selected and by a memory block unit when a memory block not including the bad area is selected.

The controller may be configured to treat another memory layer other than the at least one memory layer including the bad memory cell, together with the at least one memory layer including the bad memory cell, as a bad area. Each memory cell may include a semiconductor pillar which is formed to penetrate memory layers included in each memory block and provides channels to memory cells of each memory block, a first width of the semiconductor pillar is wider than a second width of the semiconductor pillar, and the first width corresponds to a memory layer including the bad memory cell and the second width corresponds to the another memory layer.

According to example embodiments, a nonvolatile memory device includes a nonvolatile memory portion including a plurality of memory blocks. Each memory block may include at least one cell string containing a plurality of cell transistors stacked on a substrate. Each cell string may include a semiconductor pillar that penetrates the plurality of cell transistors. The device may further include a controller configured to manage a bad area of the nonvolatile memory portion when the memory device detects a bad cell transistor in one of the plurality of memory blocks.

The controller may be configured to detect the bad area of the nonvolatile memory portion in response to receiving at least one of a read fail signal, a program fail signal, and an erase fail signal when at least one of the plurality of memory blocks is accessed by the controller.

Each memory block may include a plurality of sub-memory blocks. Each sub-memory block may contain at least one row of cell transistor in the memory block. The controller may be configured to manage the bad area of the nonvolatile memory portion during a first programming operation by storing data of the first programming operation in a first-sub memory block of a first memory block, and storing data of the first programming operation in at least one other memory block when the memory device detects the first memory block includes another sub-memory block containing a bad cell transistor and the other memory block does not contain a bad cell transistor.

The controller may be configured to manage the bad area of the nonvolatile memory portion during a second programming operation by storing data of the second programming operation in at least one different memory block when the memory device detects the first memory block includes another sub-memory block containing a bad cell transistor and at least one different memory block does not contain a bad cell transistor.

According to example embodiments, a computing system may include a CPU connected via a system bus to the foregoing nonvolatile memory device.

BRIEF DESCRIPTION OF THE FIGURES

The foregoing and other features and advantages of inventive concepts will become apparent from the following description of non-limiting embodiments, as illustrated in the following figures in which like reference numerals refer to like parts throughout the various figures unless otherwise specified. The drawings are not necessarily to scale, emphasis instead being placed upon illustrating the principles of inventive concepts. In the drawings:

FIG. 3 is a diagram illustrating a memory cell array in FIG. 2.

DETAILED DESCRIPTION

Figure 1:
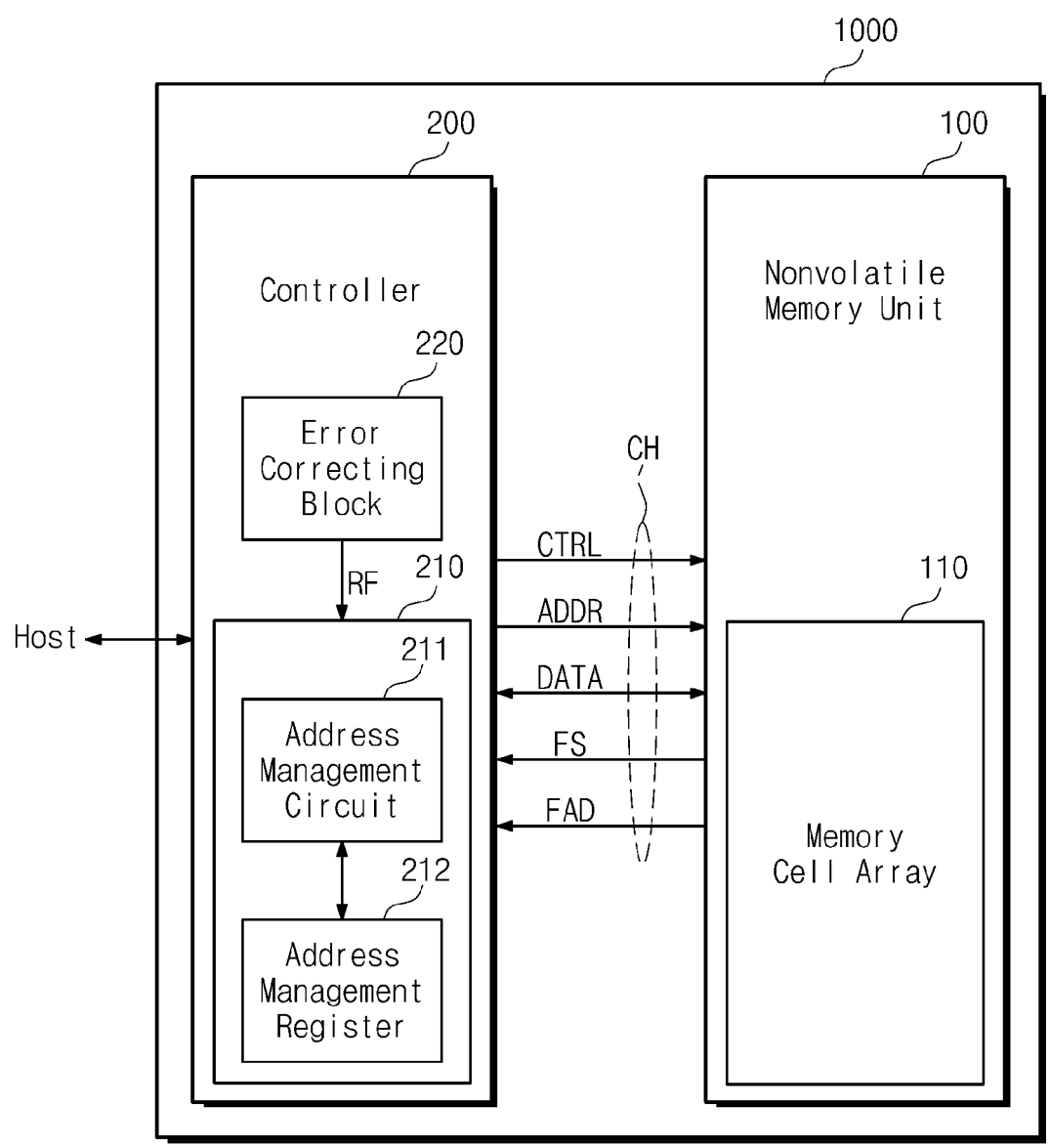
FIG. 1 is a block diagram illustrating a nonvolatile memory device coupled with a host.

Example embodiments of inventive concepts will be described more fully hereinafter with reference to the accompanying drawings, in which some example embodiments of inventive concept are shown. Example embodiments of inventive concepts may, however, be embodied in many different forms and should not be construed as limited to the embodiments set forth herein. Rather, these example embodiments are provided so that this disclosure will be thorough and complete, and will fully convey the scope of inventive concepts to those of ordinary skill in the art. In the drawings, the size and relative sizes of layers and regions may be exaggerated for clarity. Like numbers refer to like elements throughout, and thus their description will be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating a nonvolatile memory device coupled with a host. Referring to FIG. 1, a nonvolatile memory device 1000 includes a nonvolatile memory portion 100 and a controller 200. The nonvolatile memory portion 100 includes a memory cell array 110. The nonvolatile memory device 1000 stores data in the memory cell array 110 and sends data stored in the memory cell array 110 to a host.

The memory cell array 110 includes a substrate and a plurality of memory blocks although not shown in FIG. 1. Each of the memory blocks includes a plurality of sub blocks. Each sub block includes memory layers stacked on the substrate. Each memory layer includes a plurality of memory cells arranged in a direction parallel with the substrate. This will be more fully described with reference to FIGS. 3 to 7.

The controller 200 is coupled with a host and the nonvolatile memory portion 100. The controller 200 is configured to access the nonvolatile memory portion 100 in response to a request from a host. The controller 200 communicates with the nonvolatile memory portion 100 via one channel CH. The controller 200 transfers a control signal CTRL, exchanges data, and receives a fail signal FS and a fail address FAD, which are performed via the channel CH.

The controller 200 is configured to control read, program, erase, and background operations of the nonvolatile memory portion 100, for example. The controller 200 is configured to provide an interface between the nonvolatile memory portion 100 and the host. The controller 200 is configured to drive firmware for controlling the nonvolatile memory portion 100.

The controller 200 is configured to provide the control signals CTRL and the address ADDR to the nonvolatile memory portion 100. The nonvolatile memory portion 100 may perform read, program, and erase operations according to the control signal CTRL. The nonvolatile memory portion 100 reads data from an area corresponding to the address ADDR, programs data in the area corresponding to the address ADDR, or erases the area corresponding to the address ADDR.

The controller includes a flash translation layer (FTL) 210 and an error correcting block 220. The FTL 210 may manage a bad area of the memory cell array 110. The bad area is an area of which the reliability is judged to be low, and memory cells included in the bad area are not used.

The FTL 210 includes an address management circuit 211 and an address management register 212. The address management circuit 211 translates a logical address input from the host into a physical address. A mapping table storing a mapping relationship between logical addresses and physical addresses is stored in the address management register 212.

The controller 200 provides the nonvolatile memory portion 100 with the address ADDR based upon the translated physical address. For example, a logical address can be translated into a physical address of a memory block unit. This is referred to as block mapping. In this case, the controller 200 sequentially provides the nonvolatile memory portion 100 with addresses ADDR of pages included within a memory cell to be accessed. As another example, in case of the block mapping, the address management circuit 211 provides offset information with a physical address. The offset information means a difference between an address of a first page within a memory block to be accessed or an address of a specific page and an address of a page to be accessed. The controller 200 may provide addresses ADDR of pages included within a memory block to be accessed sequentially according to the offset information.

At programming and reading, the address ADDR may correspond to any page included within the memory cell array 110. At erasing, the address ADDR may correspond to any memory block included within the memory cell array 110. An erase operation is performed by the memory block. Alternatively, the erase operation is performed by a sub-memory block.

A logical address can be translated into a physical address of a page unit. This is referred to as page mapping. In this case, the controller 200 provides the nonvolatile memory portion 100 with a physical address translated by the FTL 210 as an address ADDR illustrated in FIG. 1.

According to an example embodiments of inventive concepts, the address management circuit 211 manages a bad area by a memory layer unit or a sub-memory block unit, not a memory block unit. For example, the address management circuit 211 manages the bad area by a memory layer unit or a sub-memory block unit, regardless of whether an erase operation is executed by a memory block unit or by a sub-memory block unit.

The address management circuit 211 provides a physical address and simultaneously stores it in the address management register 212. In the event that a bad memory cell is generated, the address management circuit 211 judges at least one memory layer including the bad memory cell to be a bad area. Information (hereafter, referred to as bad area information) about the judged bad area is stored in the address management register 212. Generation of a bad memory cell means that erasing, reading, or programming about an area corresponding to a physical address stored in the address management register 211 is failed.

At programming, the nonvolatile memory portion 100 may provide the controller 200 with a fail signal FS indicating that a program operation is failed. In response to the fail signal FS, the address management circuit 211 treats a memory layer including a program-failed page as a bad area, based upon a temporarily stored physical address.

At reading, the error correcting block 220 is configured to detect and correct erroneous bits of data read out from the nonvolatile memory portion 100 using an error correcting code (ECC).

At reading, the error correcting block 220 can correct a limited number of erroneous bits. In the event that erroneous bits exceeding the limited number exist at a selected page, the error correcting block 220 does not correct the erroneous bits. If the number of erroneous bits exceeds the limited number, the error correcting block 220 generates a read fail signal RF.

In response to the read fail signal RF, the address management circuit 211 detects that the selected page includes bad memory cells. For example, the address management circuit 211 detects the selected page by referring to a mapping table storing a mapping relationship between logical addresses and physical addresses. The address management circuit 211 treats a memory layer including the selected page as a bad area.

At erasing the controller 200 receives a fail address FAD indicating an address of a page including an erase-failed memory cell (or, a bad memory cell) from the nonvolatile memory portion 100. The address management circuit 211 treats a memory layer including the erase-failed page as a bad area based upon the fail address FAD.

At programming and reading, the address management circuit 211 may translate a logical address into a physical address, based upon bad area information stored in the address management register 212. This means that the address management circuit 211 translates a logical address into a physical address corresponding to a normal area, not a bad area.

According to example embodiments, the bad area information may be stored in the memory cell array 110 of the nonvolatile memory portion 100. Whenever the bad area information is updated, the updated bad area information can be stored in the memory cell array 110 of the nonvolatile memory portion 100. The bad area information may be stored in a desired (or alternatively predetermined area) of the memory cell array 110. For example, the bad area information may be stored in a part of a first memory block BLK1 of the memory cell array 110 in FIG. 2, but example embodiments are not limited thereto.

The address management circuit 211 loads bad area information stored in the memory cell array 110 and manages the bad area information. For example, when the nonvolatile memory device 1000 is powered off, the bad area information stored in the address management register 212 may be stored in the nonvolatile memory portion 100. When the nonvolatile memory device 1000 is powered up, the bad area information stored in the nonvolatile memory portion 100 may be loaded onto the address management register 212.

The controller 200 may further include a RAM, a processing unit, a host interface, and a memory interface. The RAM may be used as at least one of a cache memory between the nonvolatile memory portion 100 and the host or a buffer memory between the nonvolatile memory portion 100 and the host. Alternatively, the RAM can be used as the address management register 212.

The processing unit controls an overall operation of the controller 200. For example, the processing unit may perform a function of the address management circuit 211.

The host interface may include the protocol for executing data exchange between the host and the controller 200. The host interface may communicate with an external device (e.g., the host) via at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and an IDE (Integrated Drive Electronics) protocol, but example embodiments are not limited thereto. The host interface 124 can communicate with the host using the proprietary interface instead of the above-described protocols. The memory interface interfaces with the nonvolatile memory portion 200. The memory interface includes a NAND interface or a NOR interface.

The controller 200 and the nonvolatile memory portion 100 may be integrated in a single semiconductor device. The controller 200 and the nonvolatile memory portion 100 may be integrated in a single semiconductor device to form a memory card. For example, the controller 200 and the nonvolatile memory portion 100 may be integrated in a single semiconductor device to form a memory card such as a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, or the like, but example embodiments are not limited thereto.

The controller 200 and the nonvolatile memory portion 100 may be integrated in a single semiconductor device to form a solid state drive (SSD). The SSD includes a storage device configured to store data in a semiconductor memory. If the nonvolatile memory device 1000 is used as the SSD, it is possible to remarkably improve an operating speed of a host coupled with the nonvolatile memory device 1000.

According to example embodiments, the nonvolatile memory device 1000 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, or one of various electronic devices constituting a computing system, but example embodiments are not limited thereto.

According to example embodiments, the nonvolatile memory portion 110 or the nonvolatile memory device 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like, but example embodiments are not limited thereto.

Figure 2:
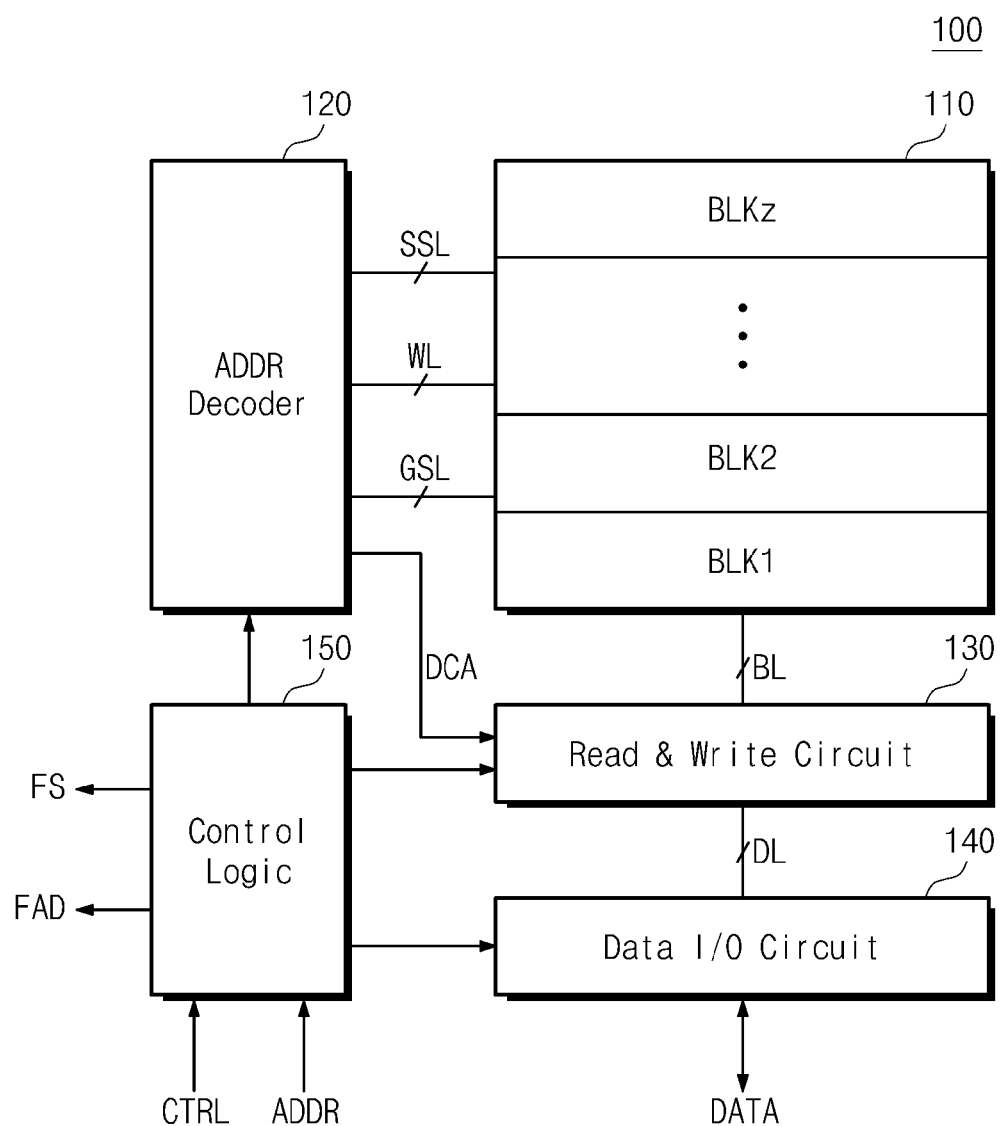
FIG. 2 is a block diagram illustrating a nonvolatile memory portion according to example embodiments of inventive concepts.

FIG. 2 is a block diagram illustrating a nonvolatile memory portion according to example embodiments of inventive concepts. Referring to FIG. 2, a nonvolatile memory portion 100 includes a memory cell array 110, an address decoder 120, a read/write circuit 130, a data input/output circuit 140, and control logic 150.

The memory cell array 110 includes a plurality of memory blocks BLK1 to BLKz. Each memory block includes a plurality of memory layers stacked on a substrate. The plurality of memory layers may be stacked along a direction perpendicular to the substrate. Each memory layer includes a plurality of memory cells arranged on the substrate in row and column directions. That is, the memory cells are arranged on the substrate in row and column directions and stacked along a direction perpendicular to the substrate, so that they form a three-dimensional structure. The memory cell array 110 includes memory cells, each storing one or more bits of data.

The address decoder 120 is configured to operate in response to the control of the control logic 150. The address decoder 120 receives an address ADDR from the control logic 150.

The address decoder 120 decodes a block address of the input address ADDR. At least one memory block may be selected according to the decoded block address. The address decoder 120 decodes a row address of the input address ADDR. The address decoder 120 is configured to select a word line WL corresponding to the decoded row address. The address decoder 120 is configured to select a string selection line SSL and a ground selection line GSL corresponding to the decoded row address among string selection lines SSL and ground selection lines GSL. The address decoder 120 may select a line corresponding to the row address by applying different voltages to a selected word line and unselected word lines.

The address decoder 120 is configured to decode a column address of the input address ADDR. The address decoder 120 transfers the decoded column address DCA to the read/write circuit 130.

According to example embodiments, the address decoder 120 may include a row decoder configured to decode a row address, a column decoder configured to decode a column address, an address buffer configured to store an address ADDR, and the like.

The read/write circuit 130 may be coupled with the memory cell array 110 via bit lines BL. The read/write circuit 130 is configured to exchange data with the data input/output circuit 140. The read/write circuit 130 operates responsive to the control of the control logic 150. The read/write circuit 130 receives the decoded column address DCA from the address decoder 120. The read/write circuit 130 selects a part of the bit lines BL in response to the decoded column address DCA.

The read/write circuit 130 is configured to receive data and to write it in the memory cell array 110. The read/write circuit 130 is configured to read data from the memory cell array 110 and to output it to the data input/output circuit 140. The read/write circuit 130 is configured to read data from a first storage area of the memory cell array 110 and to write it in a second storage area thereof. That is, the read/write circuit 130 performs a copy-back operation.

The read/write circuit 130 may include constituent elements such as a page buffer (or, a page register), a column selector circuit, a data buffer, and the like. Alternatively, the read/write circuit 130 may include constituent elements such as a sense amplifier, a write driver, a column selector circuit, a data buffer, and the like.

The data input/output circuit 140 is coupled with the read/write circuit 130 via data lines DL. The data input/output circuit 140 operates responsive to the control of the control logic 150. The data input/output circuit 140 is configured to exchange data with an external device. The data input/output circuit 140 is configured to transfer data from the external device into the read/write circuit 130 via the data lines DL. The data input/output circuit 140 is configured to output data transferred from the read/write circuit 130 via the data lines DL to the external device. For example, the data input/output circuit 140 includes a data buffer.

The control logic 150 is coupled with the address decoder 120, the read/write circuit 130, and the data input/output circuit 140. The control logic 150 is configured to control an overall operation of the nonvolatile memory portion 100 in response to a control signal CTRL input from a controller 200. The control logic 150 provides the input address ADDR to the address decoder 120.

At programming, an incremental step pulse programming (ISPP) manner may be used. With the ISPP manner, a program voltage stepwise increased may be applied to a selected word line. This enables threshold voltages of memory cells to be programmed to increase. Afterwards, a verification read operation may be carried out using a program verification voltage. If threshold voltages of memory cells to be programmed don't reach the program verification voltage, a program voltage increased by a desired (or alternatively predetermined) voltage may be applied to the selected word line. The ISPP operation may be carried out by iterating a program voltage applying operations and a verification read operation.

There is restricted the number of loops where an ISPP voltage is applied to a selected word line. If memory cells (i.e., bad memory cells) not reaching the program verification voltage within the restricted loop number exist, the control logic 150 generates a fail signal FS indicating program fail. The fail signal FS is sent to the controller 200.

According to example embodiments, the ISPP manner can be applied to an erase operation. In this case, a selected memory block is supplied with an erase voltage which is increased stepwise. After the erase voltage is applied to the selected memory block, a verification read operation is carried out using an erase verification voltage. Like the program operation using the ISPP manner, an erase voltage applying operation and a verification read operation are iterated. For example, the control logic 150 performs the verification read operation in which pages within the erased/selected memory block are sequentially read. The control logic 150 sequentially generates page addresses of the erased memory block at the verification read operation.

According to example embodiments, there is restricted the number of loops where ISPP voltages are applied to the selected memory block.

If memory cells (i.e., bad memory cells) not reaching the erase verification voltage within the restricted loop number exist, the control logic 150 generates a fail address FAD indicating an address of an erase-failed page.

According to example embodiments, the erase operation may be accomplished by applying an erase voltage to the selected memory block once. After the erase voltage is applied to the selected memory block, a verification read operation is performed using an erase verification voltage. If memory cells (i.e., bad memory cells) not reaching the erase verification voltage exist, the control logic 150 generates an address of an erase-failed page as a fail address FAD.

FIG. 3 is a diagram illustrating a memory cell array in FIG. 2. Referring to FIG. 3, a memory cell array 110 includes a plurality of memory blocks BLK1 to BLKz. Each of the memory blocks BLK1 to BLKz is formed to have a three-dimensional structure (or, a vertical structure). For example, each of the memory blocks BLK1 to BLKz includes structures extending along first to third directions. For example, each of the memory blocks BLK1 to BLKz includes a plurality of NAND strings NS extending along the second direction. A plurality of NAND strings NS is provided to be arranged along the first and third directions.

Each of the memory blocks BLK1 to BLKz is connected with a plurality of bit lines BL, a plurality of string selection lines SSL, a plurality of ground selection lines GSL, a plurality of word lines WL, and a common source line CSL. The memory blocks BLK1 to BLKz will be more fully described with reference to FIG. 4.

According to example embodiments, the memory blocks BLK1 to BLKz may be selected by an address decoder 120 in FIG. 2. For example, the address decoder 120 is configured to select a memory block BLKi (i=1 to k) corresponding to a decoded block address among the memory blocks BLK1 to BLKz.

Figure 4:
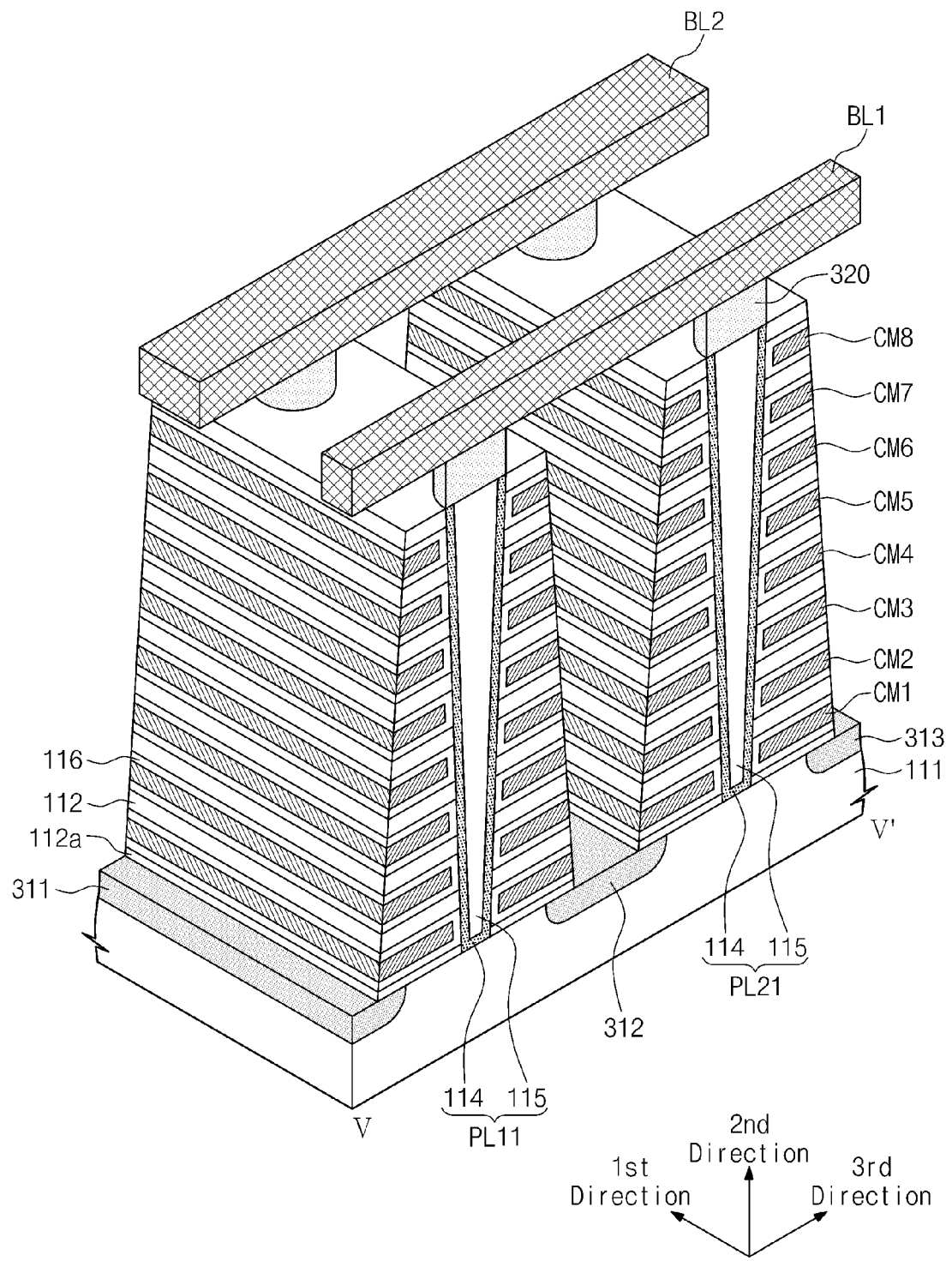
FIG. 4 is a perspective view of one of memory blocks in FIG. 3.
Figure 5:
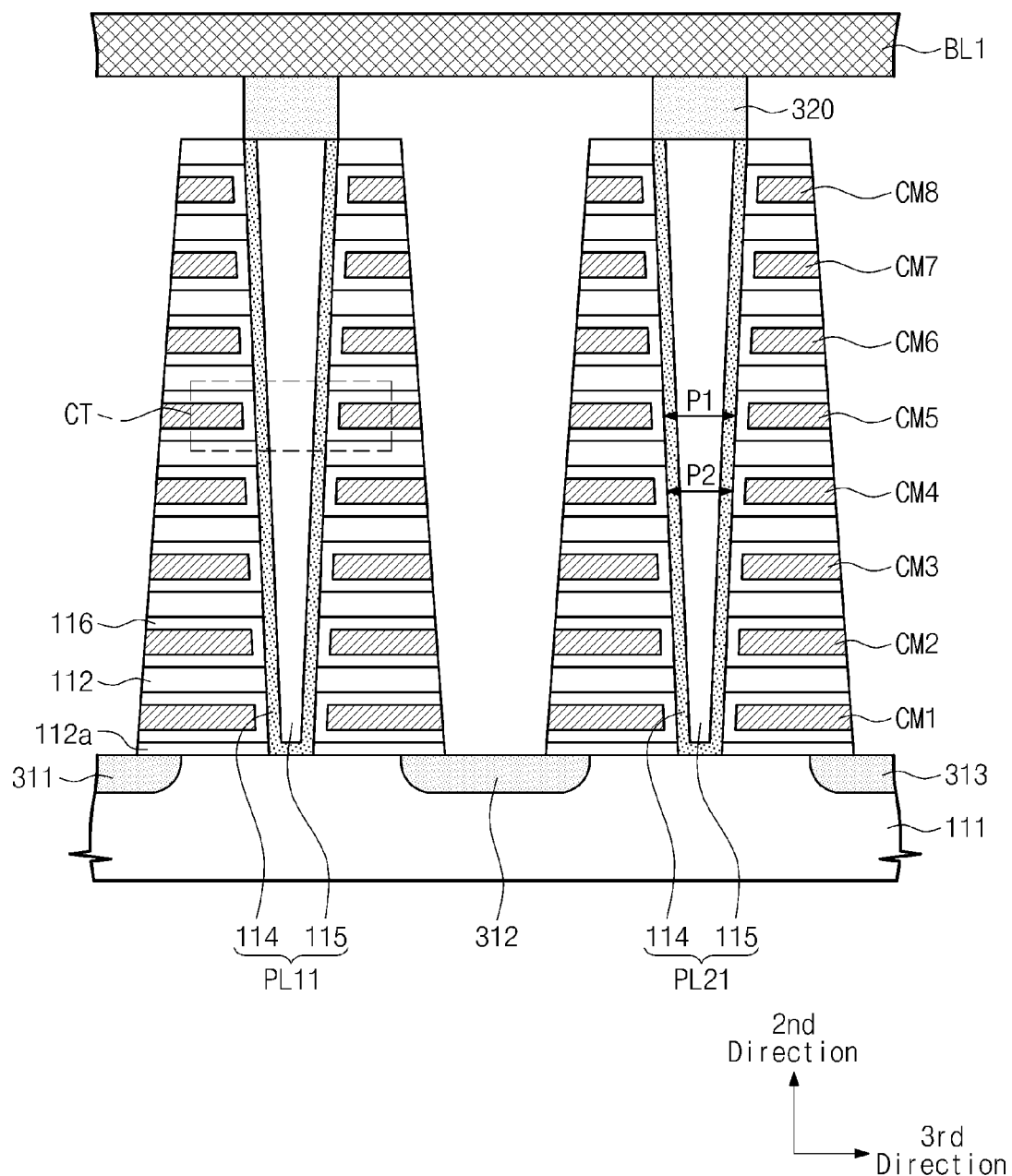
FIG. 5 is a cross-sectional view taken along a line V-V' in FIG. 4.

FIG. 4 is a perspective view of one of memory blocks in FIG. 3. FIG. 5 is a cross-sectional view taken along a line V-V' in FIG. 4.

A memory block includes a substrate 111. The substrate 111 may be a well having a first conductive type, for example. The substrate 111 may be a p-well in which the Group III element such as boron is injected, but example embodiments are not limited thereto. The substrate 111 may be a pocket p-well which is provided within an n-well. Below, it is assumed that the substrate 111 is a p-well (or, a pocket p-well). However, the substrate 111 is not limited to a p-type.

Figure 6:
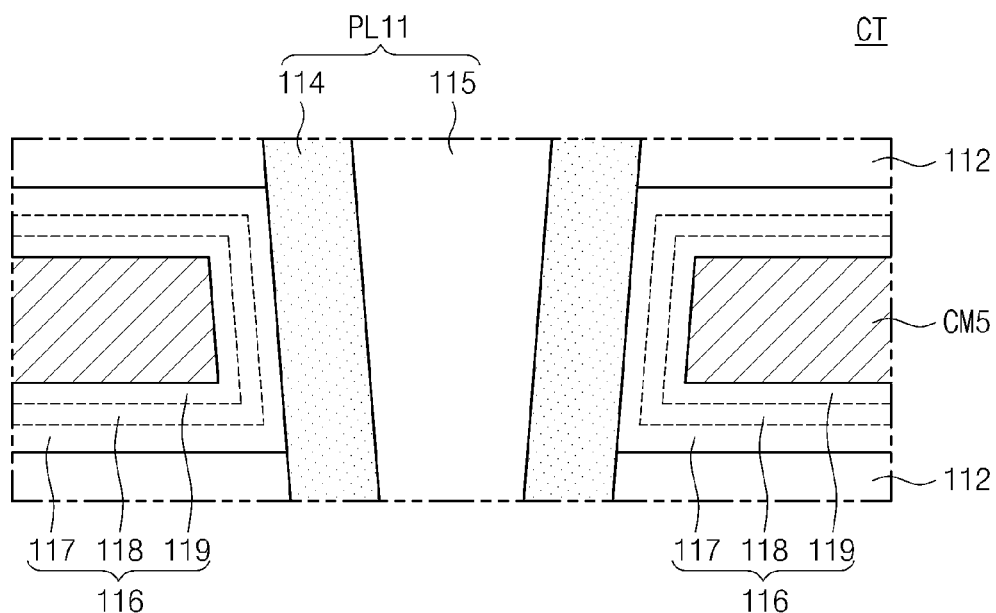
FIG. 6 is a diagram illustrating one of the cell transistors in FIG. 5.

A plurality of doping regions 311 to 313 extend along the first direction in the substrate 111. The doping regions 311 to 313 are spaced apart from one another along the third direction. The doping regions 311 to 313 illustrated in FIGS. 4 to 6 are defined as a first doping region 311, a second doping region 312, and a third doping region 313.

The first to third doping regions 311 to 313 have a second conductive type different from that of the substrate 111. For example, the first to third doping regions 311 to 313 are an n-type. Below, it is assumed that the first to third doping regions 311 to 313 are the n-type. However, the first to third doping regions 311 to 313 are not limited to the n-type.

Between two adjacent doping regions of the first to third doping regions 311 to 313, a plurality of insulation materials 112 and 112a are provided sequentially on the substrate 111 along the second direction (i.e., a direction perpendicular to the substrate 111). The insulation materials 112 and 112a are spaced apart along the second direction. The insulation materials 112 and 112a extend along the first direction. For example, the insulation materials 112 and 112a may include an insulation material such as a dielectric material, for example a silicon oxide film, but example embodiments are not limited thereto. A thickness of the insulation material 112a contacting with the substrate 111 is thinner than that of the insulation material 112.

Between two adjacent doping regions of the first to third doping regions 311 to 313, a plurality of semiconductor pillars PL11, PL12, PL21, and PL22 are arranged sequentially along the first direction so as to penetrate the plurality of insulation materials 112 and 112a along the second direction. For example, the semiconductor pillars PL11, PL12, PL21, and PL22 may contact with the substrate 111 through the insulation materials 112 and 112a.

The semiconductor pillars PL11, PL12, PL21, and PL22 may be formed of multiple layers, respectively. Each of the semiconductor pillars PL11, PL12, PL21, and PL22 includes a channel film 114 and an inner material 115. In the semiconductor pillars PL11, PL12, PL21, and PL22, an inner material and a channel film surrounding the inner material are provided.

The channel films 114 include a semiconductor material (e.g., silicon such as polycrystalline silicon, but not limited thereto) having a first conductive type. For example, the channel films 114 may include a semiconductor material (e.g., silicon) having the same conductive type as the substrate 111. Below, it is assumed that the channel films 114 include p-type silicon. However, the channel films 114 are not limited to the p-type silicon. For example, the channel films 114 can include an intrinsic semiconductor being a nonconductor.

The inner materials 115 may include an insulation material. For example, the inner materials 115 may include an insulation material such as a dielectric material, for example silicon oxide, but example embodiments are not limited thereto. Alternatively, the inner materials 115 may include air gap.

Between two adjacent doping regions of the first to third doping regions 311 to 313, information storage films 116 are on exposed surfaces of the insulation materials 112 and 112a and the semiconductor pillars PL11, PL12, PL21, and PL22. In FIG. 4, for example, a thickness of each of the information storage films 116 is less than a distance between the insulation materials 112 and 112a. The closer to the substrate, the narrower a width of each of the semiconductor pillars PL11, PL12, PL21, and PL22.

Between two adjacent doping regions of the first to third doping regions 311 to 313, conductive materials CM1 to CM8 are on exposed surfaces of the information storage films 116. In particular, the conductive materials CM1 to CM8 extending along the first direction are provided between an information storage film provided at a lower surface of an upper insulation material of the insulation materials 112 and 112a and an information storage film provided at an upper surface of a lower insulation material of the insulation materials 112 and 112a. The conductive materials CM1 to CM8 may include a metallic conductive material, or a nonmetallic conductive material such as polysilicon (e.g., doped polysilicon), but example embodiments are not limited thereto.

An information storage film 116 on an upper surface of an insulation material 112 at the uppermost layer among the insulation materials 112 and 112a can be removed. An information storage film 116 at a side opposite to the semiconductor pillars PL11, PL12, PL21, and PL22 among the insulation materials 112 and 112a can be removed.

A plurality of drains 320 are on the plurality of semiconductor pillars PL11, PL12, PL21, and PL22, respectively. The drains 320 may include a semiconductor material (e.g., silicon, such as doped polysilicon, but not limited thereto) having the second conductive type, for example. The drains 320 may include an n-type semiconductor material (e.g., silicon).

Below, it is assumed that the drains 320 include n-type silicon. However, example embodiments are not limited thereto. The drains 320 can be extended to the upside of the channel films 114 of the semiconductor pillars PL11, PL12, PL21, and PL22.

Bit lines BL1 and BL2 extending in the third direction are on the drains 320 so as to be spaced apart from one another along the first direction. The bit lines BL1 and BL2 are coupled with the drains 320. According to example embodiments, the drains 320 and the bit lines BL1 and BL2 may be connected via contact plugs (not shown). The bit lines BL1 and BL2 may include a metallic conductive material, or a nonmetallic conductive material such as polysilicon (e.g., doped polysilicon), but example embodiments are not limited thereto.

Figure 7:
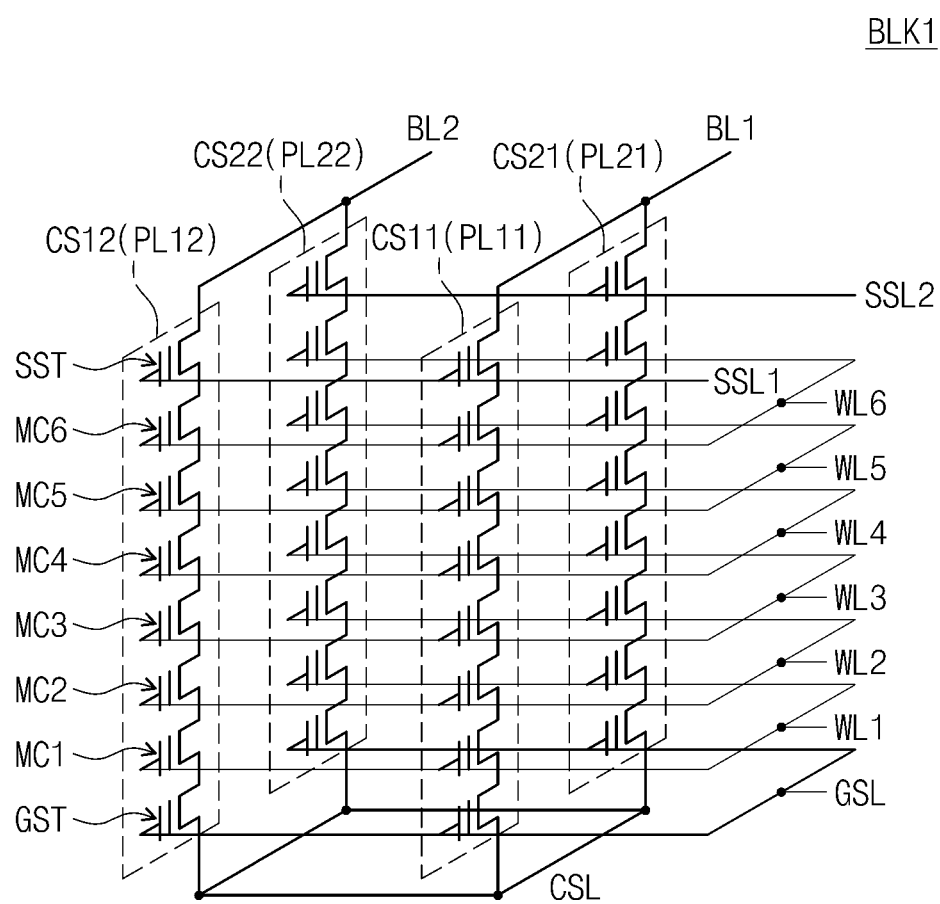
FIG. 7 is a circuit diagram illustrating an equivalent circuit of a memory block.

Memory block BLK1 includes rows and columns of the semiconductor pillars PL11, PL12, PL21, and PL22 (see FIG. 7). Semiconductor pillars PL11 and PL12 coupled with conductive materials CM1 to CM8 between the first doping region 311 and the second doping region 312 via the information storage films 115 are a first row of semiconductor pillars. Semiconductor pillars PL21 and PL22 coupled with conductive materials CM1 to CM8 between the second doping region 312 and the third doping region 313 via the information storage films 115 are a second row of semiconductor pillars. That is, a row direction is the first direction. Columns of semiconductor pillars PL11, PL12, PL21, and PL22 are connected to the bit lines BL1 and BL2. Semiconductor pillars PL11 and PL21 connected with the bit line BL1 via the drains 320 are a first column of semiconductor pillars. Semiconductor pillars PL12 and PL22 connected with the bit line BL2 via the drains 320 are a second column of semiconductor pillars. That is, a column direction is the third direction.

The conductive materials CM1 to CM8 have first to eighth heights, respectively, according to a distance from the substrate 111. The conductive material CM1 closest to the substrate 111 has the first height, and the conductive material CM8 closest to the bit lines BL1 and BL2 has the eighth height.

Each of the semiconductor pillars PL11, PL12, PL21, and PL22 constitutes a cell string with an adjacent information storage film 116 and an adjacent conductive material CMj (j=1 to 8). That is, the semiconductor pillars PL11, PL12, PL21, and PL22 form cell strings with information storage films 116 and the conductive materials CM1 to CM8.

Each cell string includes a plurality of cell transistors CT stacked in a direction perpendicular to the substrate. One CT of the plurality of cell transistors is illustrated in FIG. 6. The cell transistor CT will be more fully described with reference to FIG. 6.

FIG. 6 is a diagram illustrating one of cell transistors in FIG. 5. For example, a cell transistor having a fifth height among a plurality of cell transistors corresponding to a semiconductor pillar PL11 arranged in a first row and a first column is illustrated.

Referring to FIGS. 4 to 6, a cell transistor is formed of a fifth conductive material CM5, a portion of a semiconductor pillar PL11 adjacent to the fifth conductive material CM5, and an information storage film 116 provided between the conductive material CM5 and the semiconductor pillar PL11.

The information storage films 116 extend to upper surfaces and lower surfaces of conductive materials CM1 to CM8 from regions between the conductive materials CM1 to CM8 and the semiconductor pillars PL11, PL12, PL21, and PL22. Each of the information storage films 116 includes first to third sub insulation films 117, 118, and 119.

In the cell transistors CT, the channel films 114 of the semiconductor pillars PL11, PL12, PL21, and PL22 may include the same p-type silicon as the substrate 111. The channel films 114 are formed in a direction perpendicular to the substrate 111. Accordingly, the channel films 114 of the semiconductor pillars PL11, PL12, PL21, and PL22 may act as a vertical body. Channels formed at the channel films 114 of the semiconductor pillars PL11, PL12, PL21, and PL22 are vertical channels.

The plurality of conductive materials CM1 to CM8 may act as a gate (or, a control gate).

The first sub insulation films 117 adjacent to the semiconductor pillars PL11, PL12, PL21, and PL22 may act as a tunneling insulation film. For example, the first sub insulation films 117 adjacent to the semiconductor pillars PL11, PL12, PL21, and PL22 may include dielectric film, for example a thermal oxide film such as a silicon oxide film, but example embodiments are not limited thereto.

The second sub insulation films 118 may act as a charge storage film. For example, the second sub insulation films 118 may act as a charge trap film. For example, the second sub insulation films 118 may include a nitride film or a metal oxide film (e.g., an aluminum oxide film, a hafnium oxide film, etc.) or a silicon nitride film, but example embodiments are not limited thereto.

The third sub insulation films 119 adjacent to the conductive materials CM1 to CM8 may act as a blocking insulation film. According to example embodiments, the third sub insulation films 119 may be formed of a single layer or multiple layers. The third sub insulation films 119 may be a high dielectric film (e.g., an aluminum oxide film, a hafnium oxide film, etc., but example embodiments are not limited thereto) having a dielectric constant larger than the first and second sub insulation films 117 and 118. The third sub insulation films 119 may include a silicon oxide film.

According to example embodiments, the first to third sub insulation films 117 to 119 may include ONO (oxide-nitride-oxide).

The plurality of conductive materials CM1 to CM8 acting as a gate (or, a control gate), the third sub insulation films 119 acting as a block insulation film, the second sub insulation films 118 acting as a charge storage film, the first sub insulation films 117 acting as a tunneling insulation film, and the channel films 114 acting as a vertical body may operate as cell transistors CT. For example, the cell transistors CT may be a charge trap type cell transistor.

The cell transistors CT can be used for different purposes according to height. For example, among the cell transistors CT, at least one cell transistor placed at the uppermost is used as a string selection transistor SST. At least one cell transistor placed at the lowermost is used as a ground selection transistor GST. The remaining cell transistors are used as a memory cell.

The memory block BLK1 includes a plurality of sub-memory blocks. Each sub-memory block includes a plurality of memory layers. Each memory layer is formed of memory cells having the same height. Memory cells disposed at each of the second height to the seventh height form a memory layer. Each memory layer is formed of memory cells sharing a word line.

The conductive materials CM1 to CM8 extend along a row direction (or, the first direction) and are connected with the plurality of semiconductor pillars PL11, PL12, PL21, and PL22. That is, the conductive materials CM1 to CM8 constitute conductive lines interconnecting cell transistors CT of the semiconductor pillars (PL11 and PL12) or (PL21 and PL22) in the same row.

According to example embodiments, the conductive materials CM1 to CM8 may be used as a string selection line SSL, a ground selection line GSL, or a word line WL according to the height.

FIG. 7 is a circuit diagram illustrating an equivalent circuit of a memory block. Referring to FIGS. 4 to 7, cell strings CS11 and CS21 are between a first bit line BL1 and a common source line CSL, and cell strings CS12 and CS22 are provided between a second bit line BL2 and the common source line CSL. The cell strings CS11, CS21, CS12, and CS22 correspond to semiconductor pillars PL11, PL21, PL12, and PL22, respectively.

The semiconductor pillar PL11 in a first row and a first column forms the cell string CS11 in the first row and the first column together with conductive materials CM1 to CM6 and information storage films 116. The semiconductor pillar PL12 in a first row and a second column forms the cell string CS12 in the first row and the second column together with the conductive materials CM1 to CM6 and the information storage films 116. The semiconductor pillar PL21 in a second row and the first column forms the cell string CS21 in the second row and the first column together with the conductive materials CM1 to CM6 and the information storage films 116. The semiconductor pillar PL22 in the second row and the second column forms the cell string CS22 in the second row and the second column together with the conductive materials CM1 to CM6 and the information storage films 116.

In the cell strings CS11, CS21, CS12, and CS22, cell transistors of the first height may act as a ground selection transistor GST. For example, the first conductive materials CM1 are interconnected to form a ground selection line GSL.

In the cell strings CS11, CS21, CS12, and CS22, cell transistors of the eighth height may act as a string selection transistor SST. The string selection transistors SST are connected with first and second string selection lines SSL1 and SSL2. Cell strings in the same row share a string selection line. Cell strings in different rows are connected with different string selection lines, respectively. The first and second string selection lines SSL1 and SSL2 correspond to the eighth conductive materials CM8, respectively. That is, it is understood that the semiconductor pillars PL11, PL12, PL21, and PL22, that is, rows of the cell strings CS11, CS12, CS21, and CS22 are defined by the first and second string selection lines SSL1 and SSL2.

In the cell strings CS11, CS21, CS12, and CS22, cell transistors of each of the second to seventh heights constitute a memory layer. That is, memory cells having the same height constitute a memory layer (refer to FIG. 9). Memory cells of each memory layer may share a word line. For example, cell transistors of the second to seventh heights may constitute first to sixth memory layers.

A first word line WL1 is formed by connecting the second conductive materials CM2 in common. A second word line WL2 is formed by connecting the third conductive materials CM3 in common. A third word line WL3 is formed by connecting the fourth conductive materials CM4 in common. A fourth word line WL4 is formed by connecting the fifth conductive materials CM5 in common. A fifth word line WL5 is formed by connecting the sixth conductive materials CM6 in common. A sixth word line WL6 is formed by connecting the seventh conductive materials CM7 in common.

The common source line CSL is connected in common with the cell strings CS11, CS12, CS21, and CS22. For example, the common source line CSL is formed by connecting the first to third doping regions 311 to 313.

As described above, the string selection lines SSL1 and SSL2, the word lines WL1 to WL6, and the ground selection line GSL of a selected memory block are connected with the address decoder 120. The address decoder 120 selects the string selection lines SSL1 and SSL2, the word lines WL1 to WL6, and the ground selection line GSL of the selected memory block.

Memory cells of the same height are connected in common with a word line. Accordingly, when a word line of a specific height is selected, all cell strings CS11, CS12, CS21, and CS22 connected with the selected word line are selected.

Cell strings of different rows are connected with different string selection lines, respectively. Accordingly, cell strings (CS11 and CS12) or (CS21 and CS22) of an unselected row among cell strings CS11, CS12, CS21, and CS22 connected with the same word line are electrically separated from the bit lines BL1 and BL2 by selecting and unselecting the first and second string selection lines SSL1 and SSL2. Cell strings (CS21 and CS22) or (CS11 and CS12) of a selected row are electrically connected with the bit lines BL1 and BL2.

That is, rows of the cell strings CS11, CS12, CS21, and CS22 are selected by selecting and unselecting the first and second string selection lines SSL1 and SSL2. Columns of cell strings in the selected row are selected by selecting the bit lines BL1 and BL2.

A program operation and a read operation may be carried out by the page. That is, in cell strings connected with the same string selection line, memory cells connected with the same word line are programmed at the same time. Further, in cell strings connected with the same string selection line, memory cells connected with the same word line are read at the same time. At a program operation and a read operation, an address ADDR transferred to a nonvolatile memory portion 100 from a controller 200 may correspond to a specific page.

An erase operation may be performed by the memory block. Memory cells included in a memory block are erased at the same time. At erasing, an address ADDR transferred to a nonvolatile memory portion 100 from a controller 200 may correspond to a memory block.

String selection lines SSL1 and SSL2, word lines WL1 to WL6, and a ground selection line GSL of unselected memory blocks are electrically separated from the address decoder 120 by pass circuits of a block gating part corresponding to the unselected memory blocks. Ground circuits of the block gating part corresponding to the unselected memory blocks may supply a low voltage (e.g., a ground voltage) to the string selection lines SSL1 and SSL2 and the ground selection line GSL of the unselected memory blocks. Accordingly, when string selection transistors SST and ground selection transistors GST of the unselected memory blocks are turned off, the unselected memory blocks are electrically separated from the bit lines BL1 and BL2 and the common source line CSL.

The closer to the substrate 111, the narrower widths of the semiconductor pillars PL11, PL12, PL21, and PL22. A first width P1 (refer to FIG. 5) of the semiconductor pillar PL21 corresponds to a fifth height. A second width P2 (refer to FIG. 5) adjacent to the substrate 111 corresponds to a fourth height. The second width P2 is narrower than the first width P1.

An area of a channel of a memory cell adjacent to the substrate 111 is less in size than that of a memory cell far away from the substrate 111. When F-N tunneling is caused due to a program voltage, the amount of a current flowing between a word line and a channel increases in proportion to a decrease in an area of a channel of a memory cell. The means that an increasing speed of a threshold voltage of a memory cell increases in proportion to a decrease in an area of a channel of a memory cell. Accordingly, it is difficult to control a threshold voltage of a memory cell as its channel area decreases.

That is, the reliability of data stored in a memory cell is lowered when its channel area decreases.

According to an example embodiments of inventive concepts, if a bad memory cell is detected, a memory layer including the detected bad memory cell is treated as a bad area. At least one of memory layers between the memory layer including the bad memory cell and the substrate 111 is treated as a bad area.

It is assumed that at least one of memory cells of a fifth height is a bad memory cell. According to example embodiments, memory cells of a fourth height are treated as a bad area with the memory cells of the fifth height. Memory cells of second to fourth heights can be treated as a bad area with the memory cells of the fifth height.

In FIGS. 4 to 7, the memory block BLK1 is assumed to have the first height to the eighth height and to include 2×2 cell strings. However, the number of cell strings disposed in a column direction may be proportional to a height of the memory block BLK1.

According to example embodiments, if the memory block BLK1 has the first to eighth heights, it may include 1×8 cell strings. At this time, the memory block BLK1 may be connected with eight string selection lines and a ground selection line.

If the memory block BLK1 has the first to eighth heights, it may include 1×16 cell strings. At this time, the memory block BLK1 may be connected with 16 string selection lines and a ground selection line.

Figure 8:
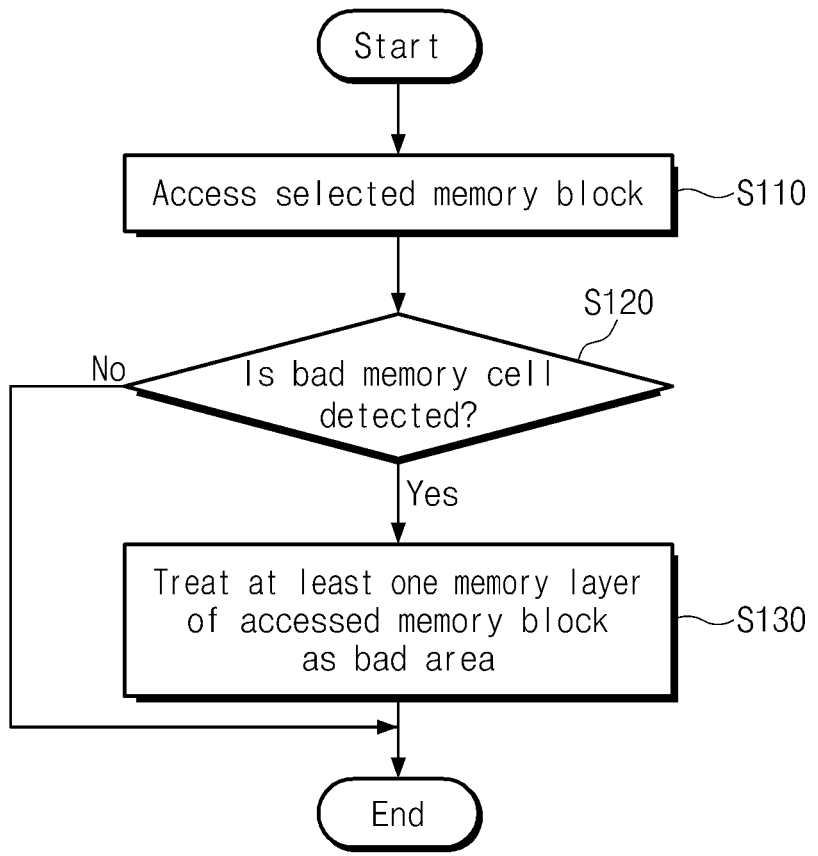
FIG. 8 is a flowchart illustrating a bad area managing method of a nonvolatile memory device in FIG. 1.

FIG. 8 is a flowchart illustrating a bad area managing method of a nonvolatile memory device in FIG. 1. Referring to FIGS. 1 and 8, in operation S110, a controller 200 accesses a selected memory block by sending an address ADDR. At a program/read operation, the address ADDR may correspond to a selected page of the selected memory block. At an erase operation, the address ADDR may correspond to the selected memory block.

In operation S120, the controller 200 judges whether a bad memory cell is detected. The controller 200 may judge whether a bad memory cell is detected, according to a fail signal FS and a fail address FAD. If a bad memory cell is detected, the method proceeds to operation S130.

In operation S130, the controller 130 treats at least one memory layer of the accessed memory block as a bad area. At this time, a memory layer treated as a bad area may include the bad memory cell.

According to example embodiments of inventive concepts, a part of the accessed memory block is treated as a bad area. This means that the accessed memory block is not treated as a bad area. Accordingly, it is possible to reduce the number of memory cells treated as a bad area.

It is assumed that a first memory cell and a second memory cell are included in different memory layers, respectively. Diameters of semiconductor pillars corresponding to memory layers are different from one another. Accordingly, threshold voltages and reliabilities of the first and second memory cells may differentiate. In this case, memory layers having the reliability higher than that of a memory layer including a bad memory cell, that is, memory layers far away from a substrate 111 as compared with the memory layer including a bad memory cell are not treated as a bad area. This means that a lifetime of memory layers not treated as a bad area increases.

Figure 9:
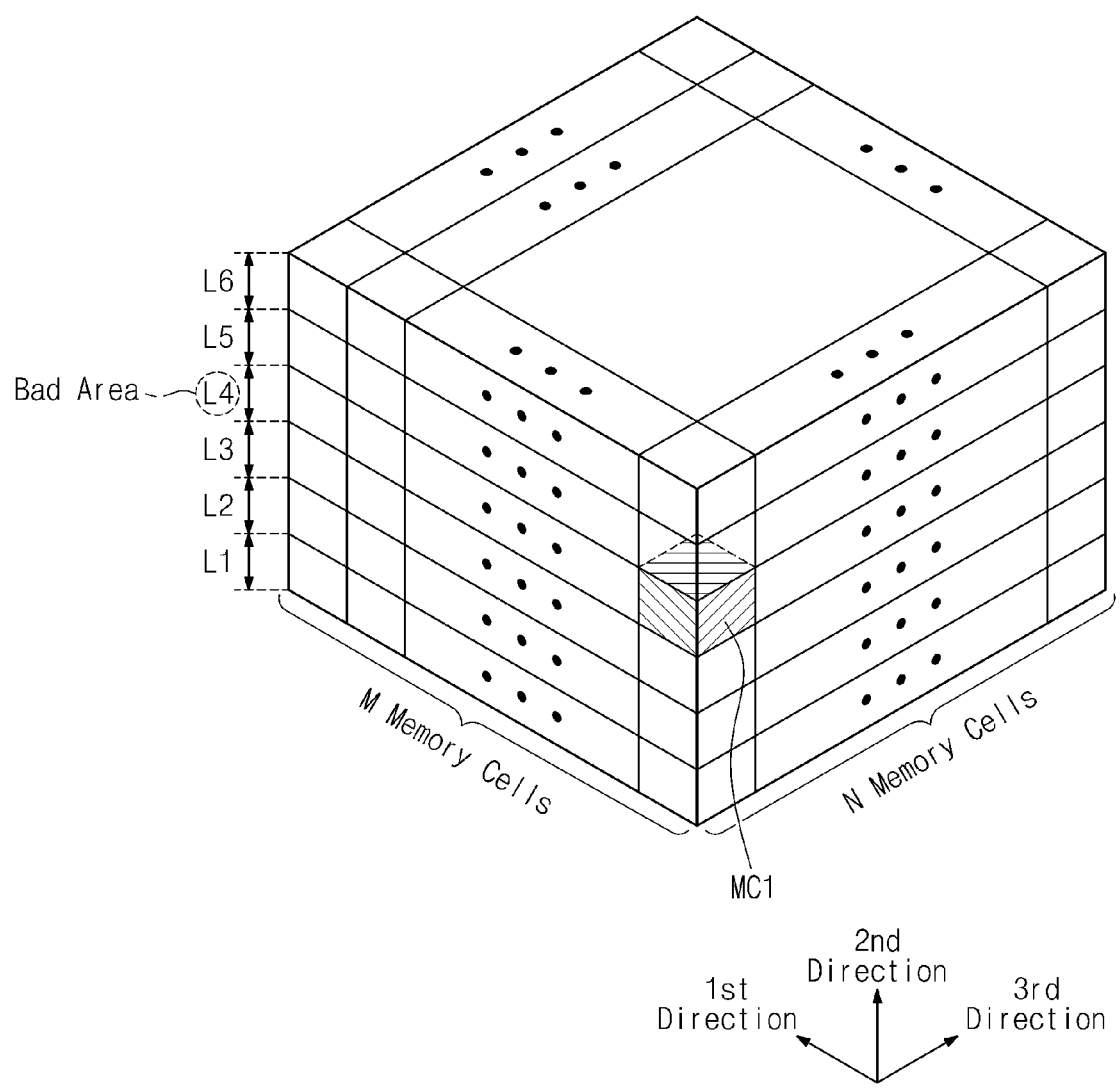
FIG. 9 is a diagram conceptually illustrating memory cells of a memory block.

FIG. 9 is a diagram conceptually illustrating memory cells of a memory block. Referring to FIGS. 4 and 9, a memory block BLK1 includes a first memory layer L1 to a sixth memory layer L6. The first to sixth memory layers are sequentially stacked in a second direction (i.e., a direction perpendicular to a substrate 111).

Below, it is assumed that the memory block BLK1 is connected with N string selection lines, M bit lines, and one ground selection line. According to this assumption, N memory cells are arranged in a third direction, and M memory cells are arranged in a first direction.

The first to sixth memory layers L1 to L6 are connected with first to sixth word lines WL1 to WL6, respectively. That is, memory cells included in each memory layer share a word line.

It is assumed that a memory cell MC1 (represented by a hatched square box) is a bad memory cell. A nonvolatile memory portion 100 (refer to FIG. 1) generates a fail signal FS when a program operation is carried out with respect to a page including the memory cell MC1 of the fourth memory layer L4. The controller 200 treats the fourth memory layer L4 as a bad area in response to the fail signal FS. According to example embodiments, when data stored in the memory block BLK1 is erased, the nonvolatile memory portion 100 generates a fail address FAD corresponding to a page including the memory cell MC1. The controller 200 treats the fourth memory layer L4 as a bad area in response to the fail address FAD.

Figure 10:
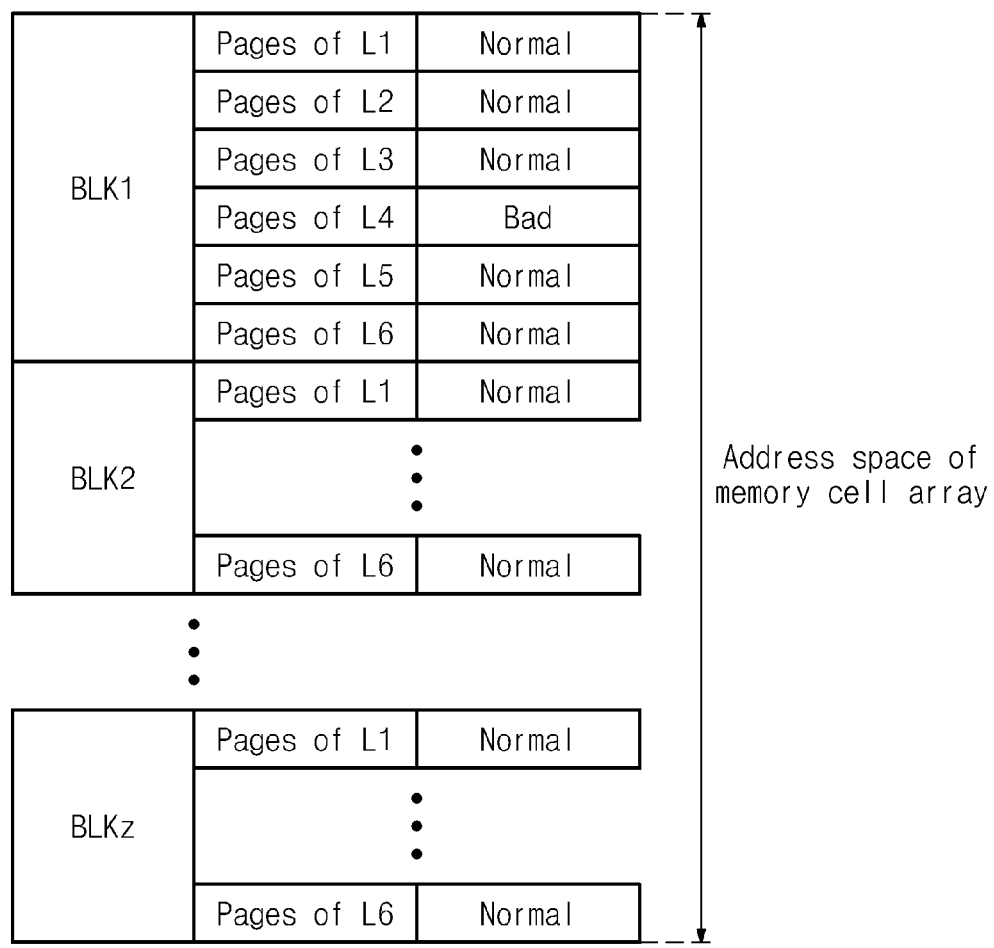
FIG. 10 is a diagram illustrating an address management register in FIG. 1.

FIG. 10 is a diagram illustrating an address management register in FIG. 1. In FIG. 10, there is illustrated bad area information after pages included in a fourth memory layer L4 of a memory block BLK1 in FIG. 9 are treated as a bad area.

Pages included in the fourth memory layer L4 are not used. That is, a flash translation layer 210 does not generate physical addresses corresponding to the pages in the fourth memory layer L4. In the memory block BLK1, pages of remaining memory layers other than the fourth memory layer L4 are used.

Figure 11:
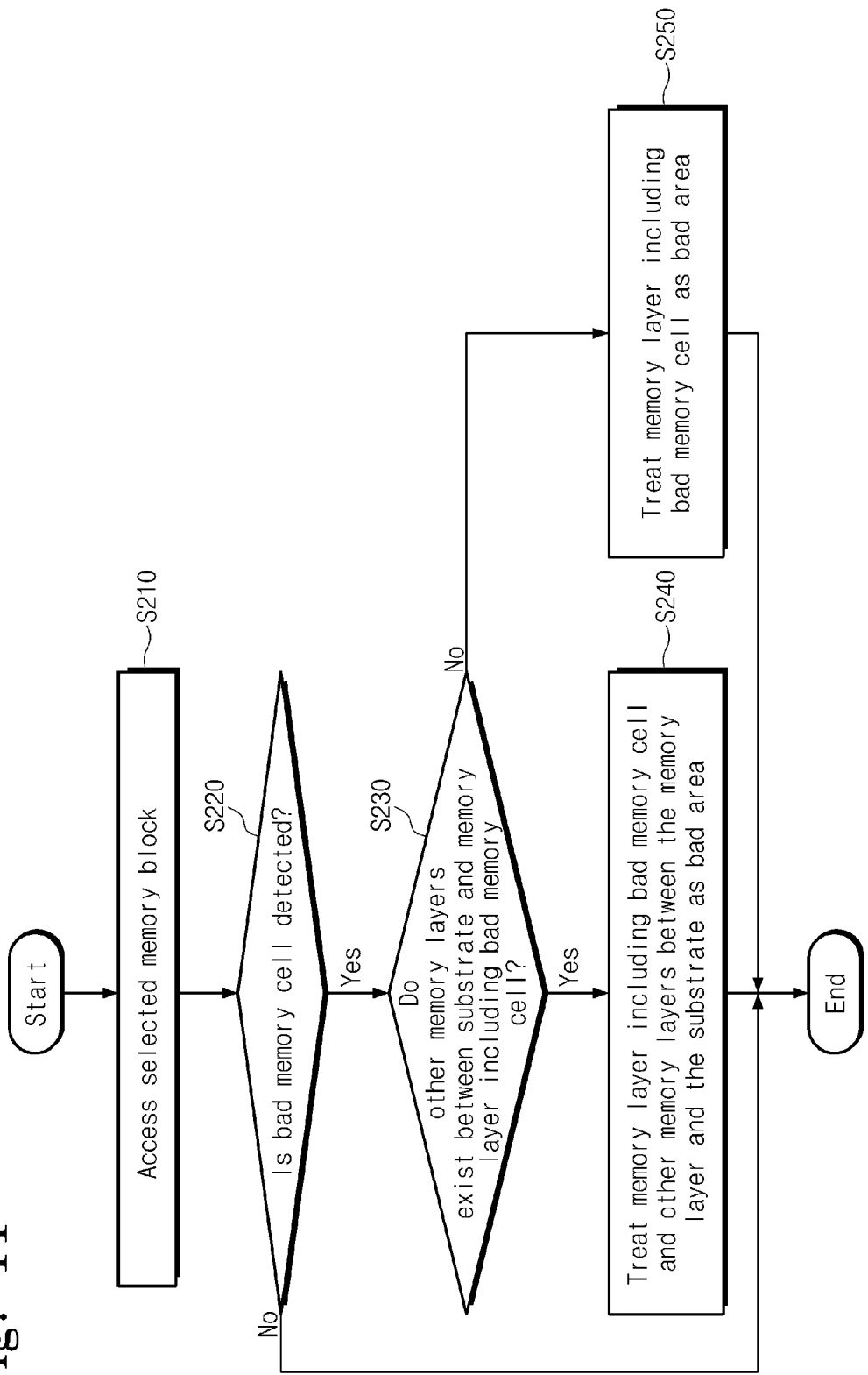
FIG. 11 is a flowchart illustrating a bad area managing method according to example embodiments of inventive concepts.

FIG. 11 is a flowchart illustrating a bad area managing method according to example embodiments of inventive concepts. Referring to FIGS. 1 and 10, in operation S210, a controller 200 accesses a selected memory block by sending an address ADDR to a nonvolatile memory portion 100. In operation S220, the controller 200 judges whether a bad memory cell is detected. The controller 200 judges whether a bad memory cell is detected, according to a fail signal FS and a fail address FAD. If a bad memory cell is detected, the method proceeds to operation S230.

In operation S230, an address management circuit 211 (refer to FIG. 1) judges whether one or more memory layers exist between a substrate 111 and a memory layer including a bad memory cell. If at least one memory layer exists between the substrate 111 and the memory layer including a bad memory cell, the method proceeds to operation S240. If no memory layer exists between the substrate 111 and the memory layer including a bad memory cell, the method proceeds to operation S250.

In operation S240, the address management circuit 211 treats both the memory layer including a bad memory cell and the at least one memory layer between the substrate 111 and the memory layer including a bad memory cell, as a bad area.

As described in FIGS. 4 to 7, a plurality of semiconductor pillars include channels of memory cells of a memory block BLK1. The closer to a substrate 111, the narrower widths of the semiconductor pillars. Among memory cells connected with the same semiconductor pillar, a channel area of a memory cell adjacent to the substrate 111 is less in size than that far away from the substrate 111. As a channel area of a memory cell decreases, the reliability of program, read, and erase operations may be lowered. The reliability of data stored in a memory layer adjacent to the substrate 111 may become stochastically lower as compared with that of data stored in a memory layer far away from the substrate 111. According to an exemplary embodiment of the inventive concept, at least one memory layer between the substrate 111 and a memory layer including a bad memory cell may be treated as a bad area with the memory layer including a bad memory cell.

In operation S250, the address management circuit 211 treats the memory layer including a bad memory cell as a bad area.

Figure 12:
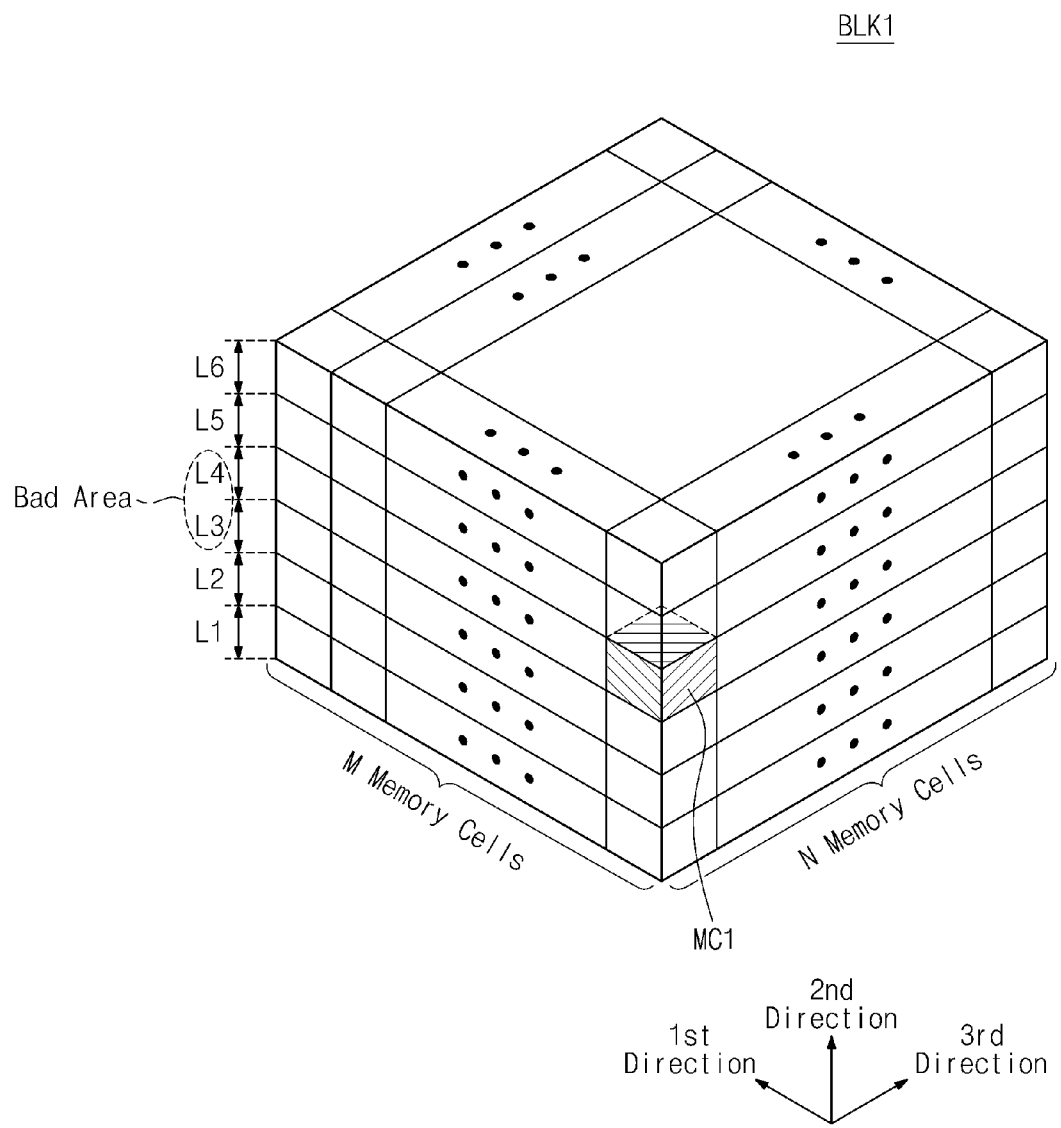
FIG. 12 is a diagram for describing the case that third and fourth memory layers are treated as a bad area.

FIG. 12 is a diagram for describing the case that third and fourth memory layers are treated as a bad area. In FIG. 12, there are conceptually illustrated memory cells of a memory block.

It is assumed that a memory cell MC1 (represented by a hatched square box) is a bad memory cell. If a bad memory cell is detected, an address management circuit 211 may treat a fourth layer L4 including the memory cell MC1 and at least one memory layer L3 between the fourth memory layer L4 and a substrate 111 as a bad area.

Figure 13:
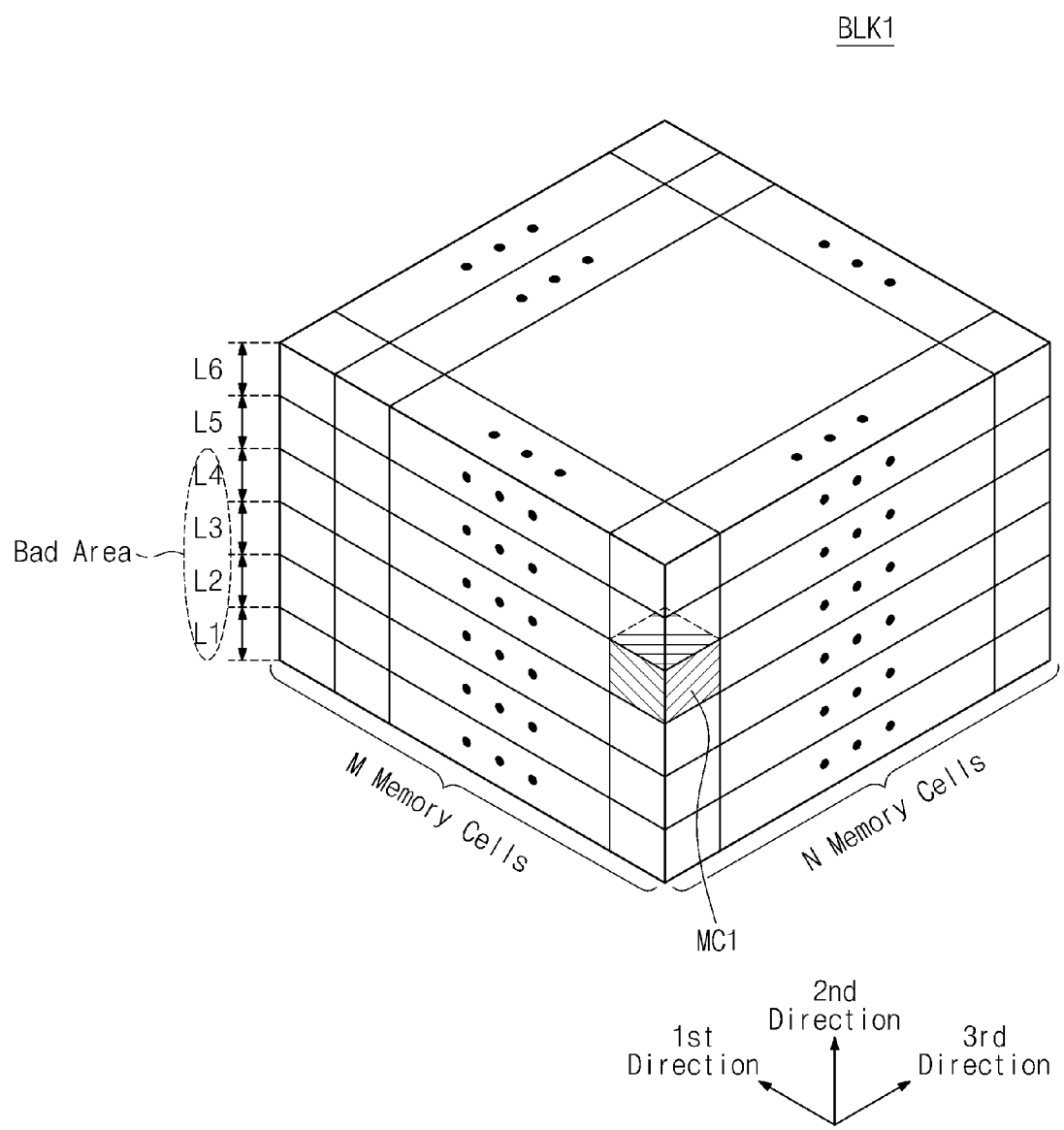
FIG. 13 is a diagram for describing the case that first to fourth memory layers are treated as a bad area.

FIG. 13 is a diagram for describing the case that first to fourth memory layers are treated as a bad area. An address management circuit 211 may treat a fourth layer L4 including the memory cell MC1 and all memory layers L1 to L3 between the fourth memory layer L4 and a substrate 111 as a bad area.

Figure 14:
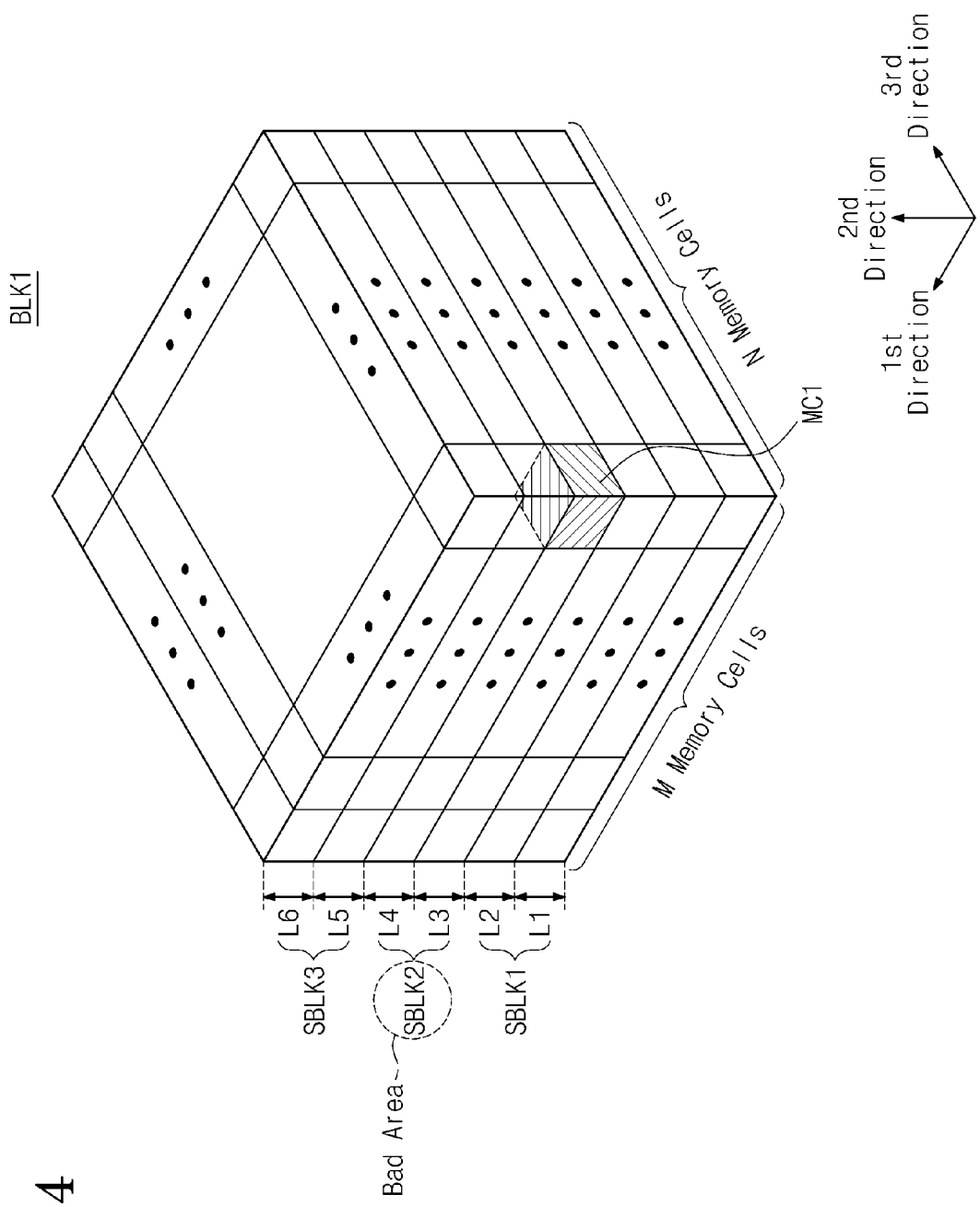
FIG. 14 is a diagram for describing the case that second sub-memory layer is treated as a bad area.

FIG. 14 is a diagram for describing the case that second sub-memory layer is treated as a bad area.

A plurality of memory layers L1 to L6 are divided into a plurality of sub-memory blocks SBLK1 to SBLK3. That is, each sub-memory block may include at least one memory layer.

According to example embodiments of inventive concepts, an address management circuit 211 manages a bad area by a unit of a sub-memory block. The address management circuit 211 may treat a sub-memory block SBLK2 including a bad memory cell as a bad area.

Figure 15:
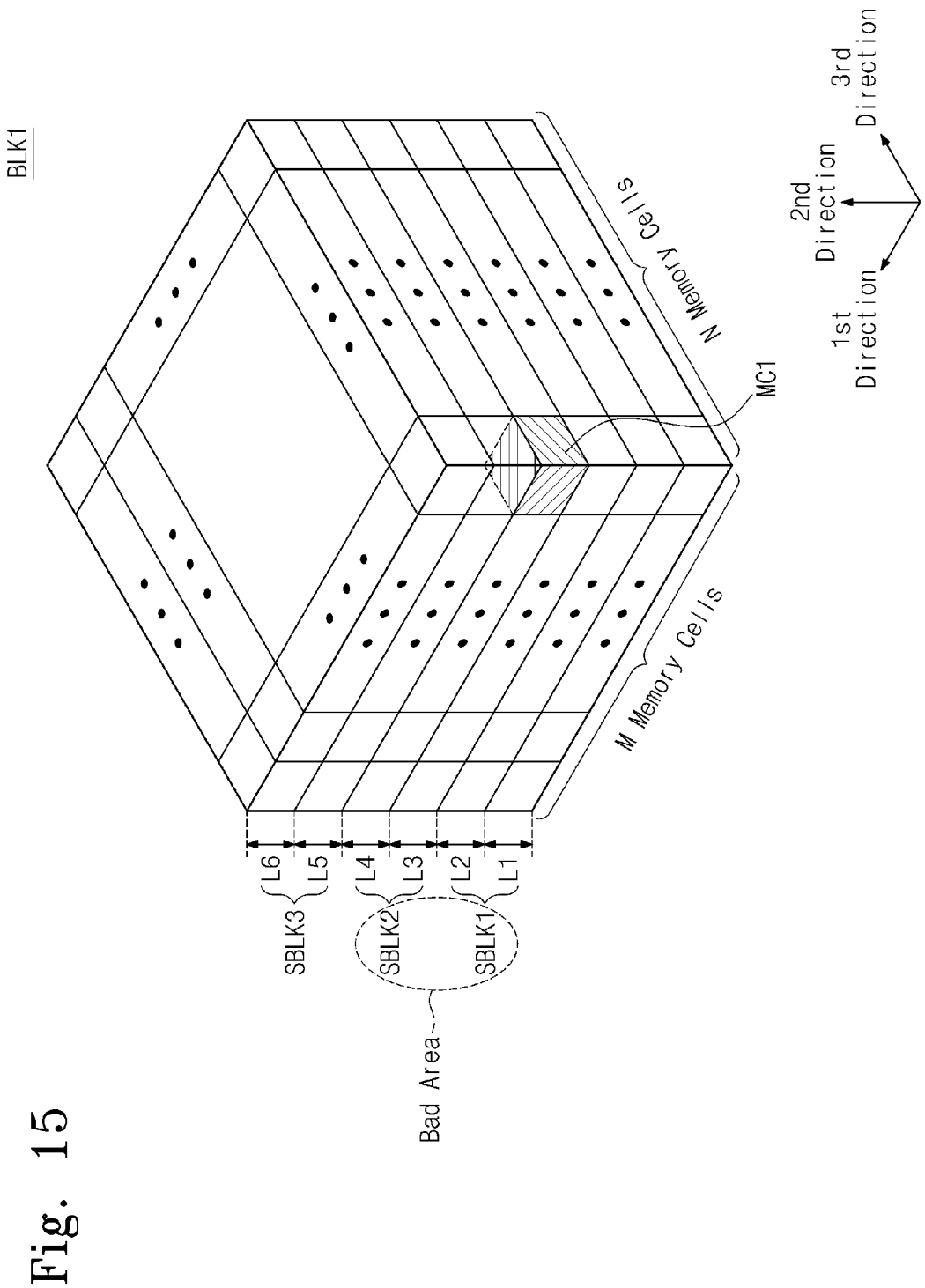
FIG. 15 is a diagram for describing the case that first and second sub-memory layers are treated as a bad area.

FIG. 15 is a diagram for describing the case that first and second sub-memory layers are treated as a bad area.

According to example embodiments of inventive concepts, at least one sub-memory block SBLK1 between a substrate 111 and a second sub-memory block SBLK2 including a bad memory cell MC1 is treated as a bad area with the second sub-memory block SBLK2 including the bad memory cell MC1. Alternatively, all sub-memory blocks between the substrate 111 and the second sub-memory block SBLK2 can be treated as a bad area with the second sub-memory block SBLK2 including the bad memory cell MC1.

Figure 16:
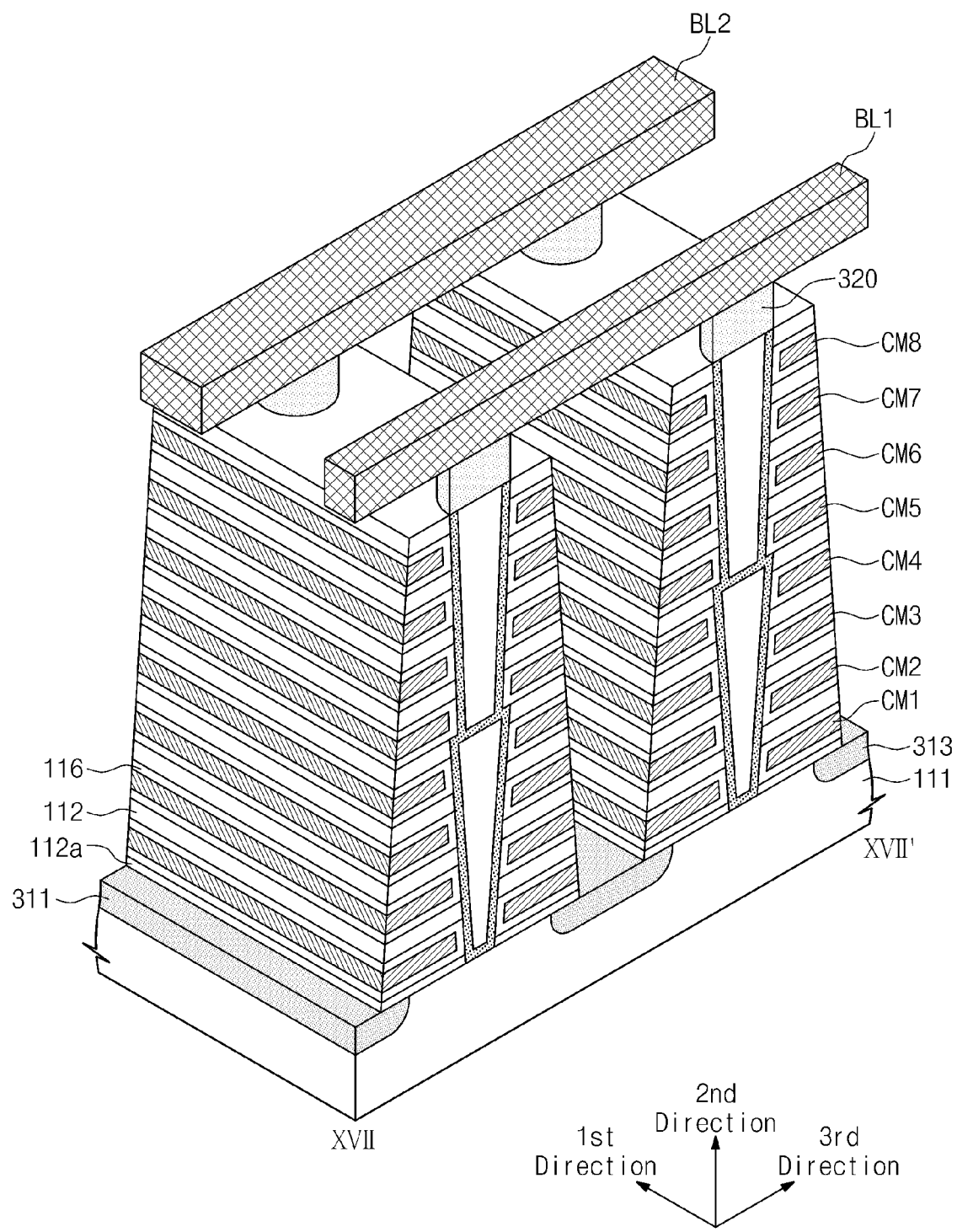
FIG. 16 is a perspective view illustrating a memory block in FIG. 3 according to example embodiments of inventive concepts.
Figure 17:
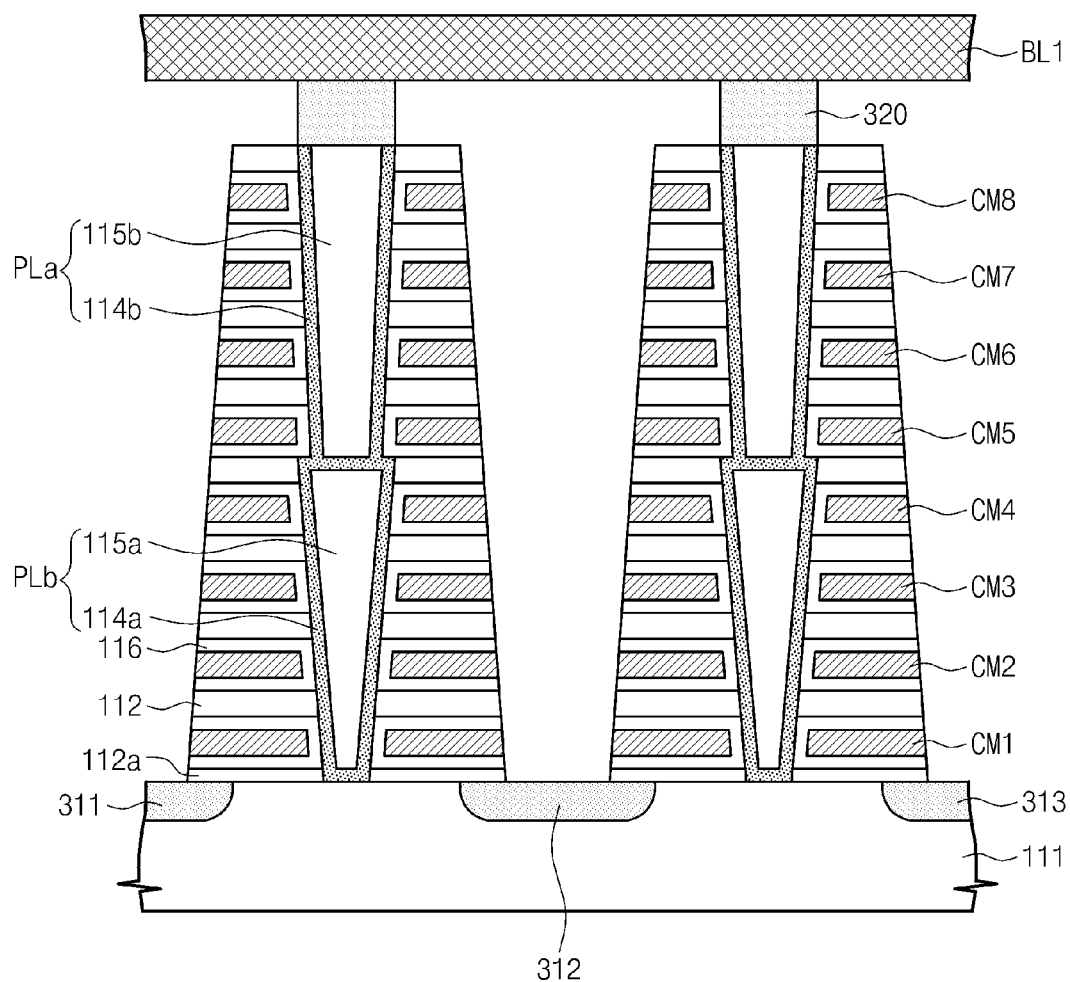
FIG. 17 is a cross-sectional view of a memory block taken along a line XVII-XVII'.

FIG. 16 is a perspective view illustrating a memory block in FIG. 3 according to example embodiments of inventive concepts. FIG. 17 is a cross-sectional view of a memory block taken along a line XVII-XVII'. As compared with a memory block BLK1 described with reference to FIGS. 4 to 6, each semiconductor pillar PL of a memory block in FIG. 16 includes a first sub semiconductor pillar PLa and a second sub semiconductor pillar PLb. Duplicate description about the same elements is thus omitted.

Referring to FIGS. 16 and 17, the first sub semiconductor pillar PLa is provided on a substrate 111. For example, a channel film 114*a* of the first sub semiconductor pillar PLa may include a p-type silicon material. The channel film 114*a* of the first sub semiconductor pillar PLa may act as a body of a second direction. An inner material 115*a* of the first sub semiconductor pillar PLa is formed of an insulation material.

A second sub semiconductor pillar PLb is provided on the first sub semiconductor pillar PLa. For example, a channel film 114*b* of the second sub semiconductor pillar PLb may include a p-type silicon material. The channel film 114b of the second sub semiconductor pillar PLb may act as a body of the second direction. An inner material 115b of the second sub semiconductor pillar PLb is formed of an insulation material. The closer to the substrate 111, the narrower widths of the first and second sub semiconductor pillars PLa and PLb.

The channel film 114a of the first sub semiconductor pillar PLa is connected with the channel film 114b of the second sub semiconductor pillar PLb. For example, the channel film 114a of the first sub semiconductor pillar PLa is connected with the channel film 114b of the second sub semiconductor pillar PLb via a p-type silicon pad (not shown).

The first sub semiconductor pillar PLa may provide a channel to cell transistors of the first to fourth heights. The second sub semiconductor pillar PLb may provide a channel to cell transistors of the fifth to eighth heights. An equivalent circuit of the memory block BLK1 described with reference to FIGS. 16 and 17 may be configured the same as that in FIG. 7. Cell transistors of the second to fourth heights may act as a memory cell, and cell transistors of the fifth to seventh heights may act as a memory cell. Memory cells of each height are connected with one word line. Memory cells connected with one word line may constitute a memory layer.

Below, it is assumed that the memory block BLK1 is connected with N string selection lines and M bit lines. With this assumption, N memory cells are disposed in a third direction, and M memory cells are disposed in a first direction.

Figure 18:
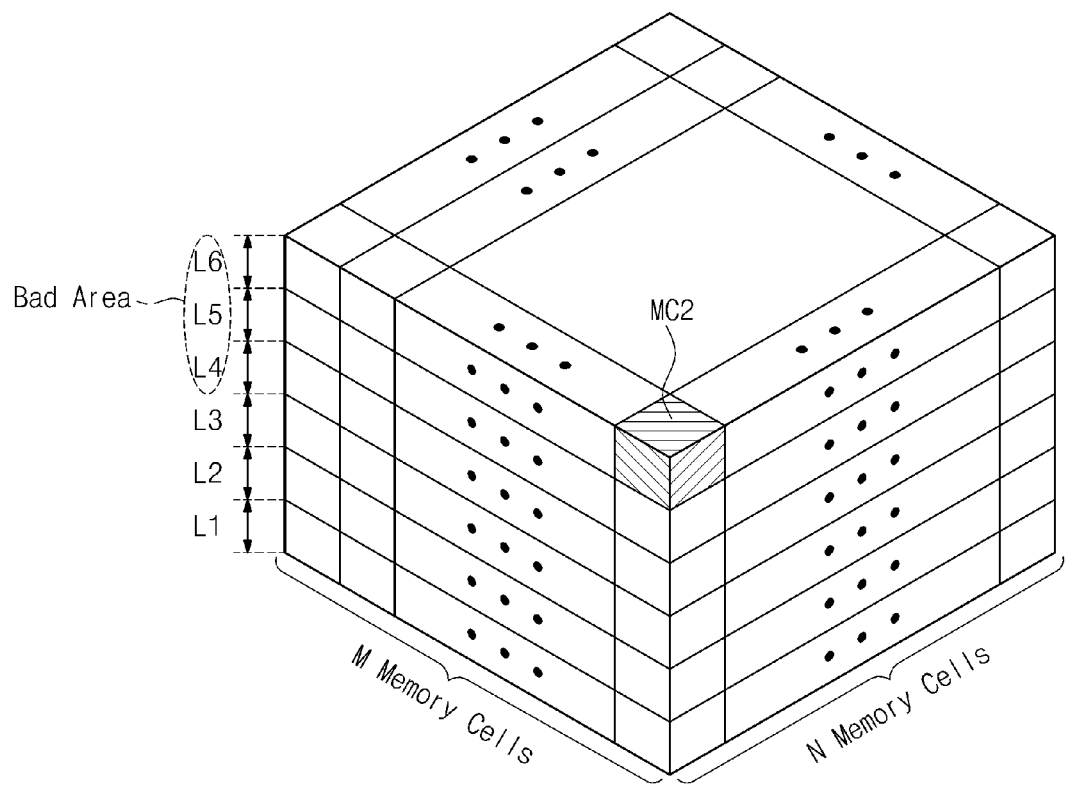
FIG. 18 is a diagram conceptually illustrating memory cells of a memory block in FIGS. 16 and 17.

FIG. 18 is a diagram conceptually illustrating memory cells of a memory block in FIGS. 16 and 17. In FIG. 18, it is assumed that a memory cell MC2 (represented by a hatched square box) is a bad memory cell.

Referring to FIGS. 16 to 18, the memory cell MC2 is included in a sixth memory layer L6. An address management circuit 211 may treat the sixth memory layer L6 as a bad area. The address management circuit 211 may treat at least one of other memory layers sharing a sub semiconductor pillar with the sixth memory layer L6 as a bad area.

Figure 19:
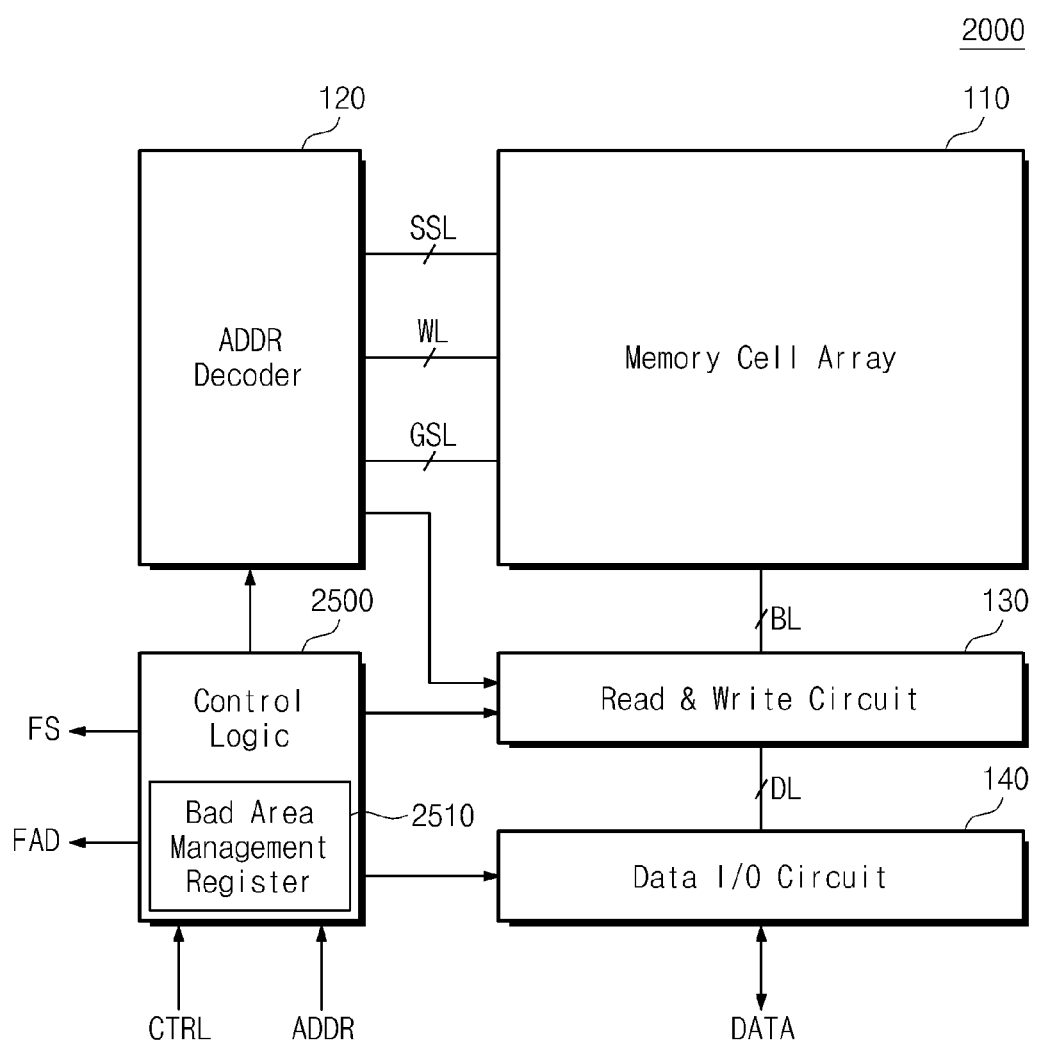
FIG. 19 is a block diagram illustrating a nonvolatile memory portion according to example embodiments of inventive concepts.

FIG. 19 is a block diagram illustrating a nonvolatile memory portion according to example embodiments of inventive concepts. Referring to FIG. 19, a nonvolatile memory portion 2000 includes a memory cell array 110, an address decoder 120, a read/write circuit 130, a data input/output circuit 140, and control logic 2500. The nonvolatile memory portion 2000 in FIG. 19 is substantially identical to that in FIG. 2 except for the control logic 2500, and duplicative description thereof is thus omitted.

The control logic 2500 includes a bad area management register 2510. The bad area management register 2510 includes bad area information. At erasing, programming, and reading, the control logic 2500 controls the address decoder 120 according to the bad area information such that a specific voltage is applied to word lines connected with a bad area.

The control logic 2500 may temporarily store an address ADDR input from a controller 200. The control logic 2500 updates the bad area information stored in the bad area management register 2510 when program fail or read fail is caused. Bad area information stored in the bad area management register 2510 may be received from the controller 200.

Figure 20:
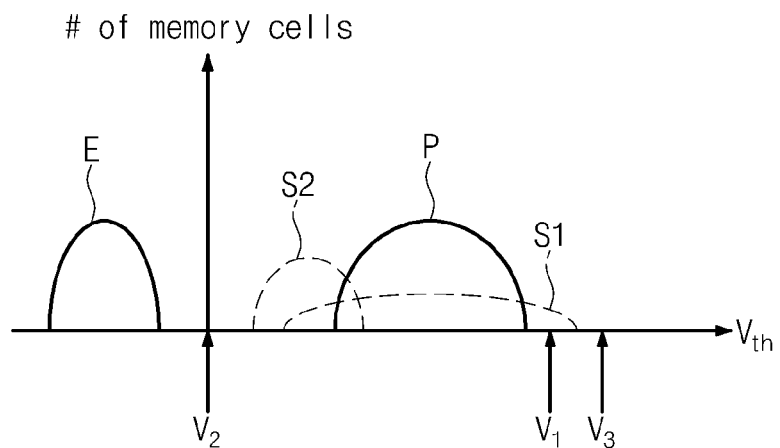
FIG. 20 is a diagram illustrating a threshold voltage distribution of memory cells in a memory cell array in FIG. 19.

FIG. 20 is a diagram illustrating a threshold voltage distribution of memory cells in a memory cell array in FIG. 19. For convenience of explanation, FIG. 20 illustrates an example of a threshold voltage distribution formed in the event that 1-bit data is stored in each memory cell of a memory cell array 110. In FIG. 20, a horizontal axis indicates a threshold voltage, and a vertical axis indicates the number of memory cells.

Referring to FIGS. 19 and 20, normally programmed memory cells may have a threshold voltage corresponding to an erase state E or a program state P. At a read operation, a first voltage V1 is applied to unselected word lines. The first voltage V1 is higher in level than threshold voltages corresponding to the erase and program states E and P. Accordingly, memory cells connected with the unselected word lines are turned on. A second voltage V2 is applied to a selected word line. Data of a selected page may be read by judging whether memory cells connected with the selected word line have the erase state E or the program state P, based upon the second voltage V2.

Threshold voltages of memory cells can be varied due to interference between memory cells. For example, threshold voltages of memory cells having the program state P can be varied to threshold voltages corresponding to a first state S1.

Some of memory cells having the first state S1 may have a threshold voltage lower in level than the first voltage V1. The remaining of the memory cells having the first state S1 may have a threshold voltage higher in level than the first voltage V1. If there are selected word lines connected with memory cells having a threshold voltage higher in level than the first voltage V1, read data may include erroneous bits. The erroneous bits may be detected and corrected by an error correcting block 220 in FIG. 1.

If the number of memory cells, having a threshold voltage higher in level than the first voltage V1, among memory cells of a selected word line exceeds a correctable erroneous bit number, the error correcting block 220 may generate a read fail signal RF. Memory layers or sub-memory blocks including the memory cells of the selected word line are judged to be a bad area. Information about the bad area thus judged is sent to a flash translation layer 210.

As programming using an ISPP manner is failed, the control logic 2500 generates the fail signal FS and simultaneously stores information about the selected page in the bad area management register 2510.

As erasing using an ISPE (incremental step pulse erasing) manner is failed, the control logic 2500 generates the fail address FAD and simultaneously stores the fail address FAD in the bad area management register 2510.

At a read operation, the control logic 2500 controls the address decoder 120 according to the bad area information such that a third voltage V3 is applied to word lines connected with the bad area. That is, the first voltage V1 is applied to unselected word lines, the second voltage V2 is applied to a selected word line, and the third voltage V3 higher in level than the first voltage V1 is applied to word lines connected with the bad area.

Likewise, at a program operation, the control logic 2500 controls the address decoder 120 such that a voltage higher in level than a voltage applied to unselected word lines is applied to word lines connected with the bad area.

Likewise, at an erase operation, the control logic 2500 controls the address decoder 120 such that a voltage higher in level than an erase voltage applied to unselected memory cells is applied to memory cells of the bad area.

According to example embodiments, after erasing data stored in a memory block including the bad area, a desired (or alternatively predetermined) voltage (e.g., the second voltage V2) may be applied to word lines connected with the bad area. In particular, the controller 200 controls the nonvolatile memory portion 2000 such that data stored in a memory block including the bad area is stored in another memory block. The controller 200 control the nonvolatile memory portion 2000 such that data stored in a memory block including the bad area is erased. Erased memory cells may have the erase state E.

At erasing, programming, or reading, the control logic 2500 may discriminate word lines connected with the bad area, based upon the bad area information stored in the bad area management register 2510. Under the control of the control logic 2500, a specific voltage (e.g., the second voltage V2) may be applied to word lines connected with the bad area such that memory cells included in the bad area are turned on.

According to example embodiments, the control logic may control the address decoder 120 such that the first voltage V1 is applied to word lines connected with the bad area like the unselected word lines.

A threshold voltage of a program-failed memory cell may be lower in level than a threshold voltage corresponding to the program state P. A threshold voltage of an erase-failed memory cell (a bad memory cell) may be lower in level than a threshold voltage corresponding to the program state P. It is assumed that bad memory cells have a threshold voltage corresponding to the second state S2. In this case, although the first voltage V1 applied to unselected word lines is applied to word lines connected with the bad area at a read operation, the bad memory cells are turned on. Accordingly, at a read operation, voltages of word lines connected with the bad area are controlled to be identical to those applied to unselected word lines.

The control logic 2500 may treat word lines connected with the bad area like word lines connected with a normal area, without considering the bad area. In this case, the bad area management register 2510 storing the bad area information is not needed.

At a program operation, the control logic 2500 may treat word lines connected with the bad area like word lines connected with a normal area, without considering the bad area. A program voltage applied to the word lines connected with the bad area may be identical to program voltages applied to unselected word lines.

At an erase operation, the control logic 2500 may treat word lines connected with the bad area like word lines connected with a normal area, without considering the bad area. An erase voltage applied to the word lines connected with the bad area may be identical to program voltages applied to unselected word lines.

Figure 21:
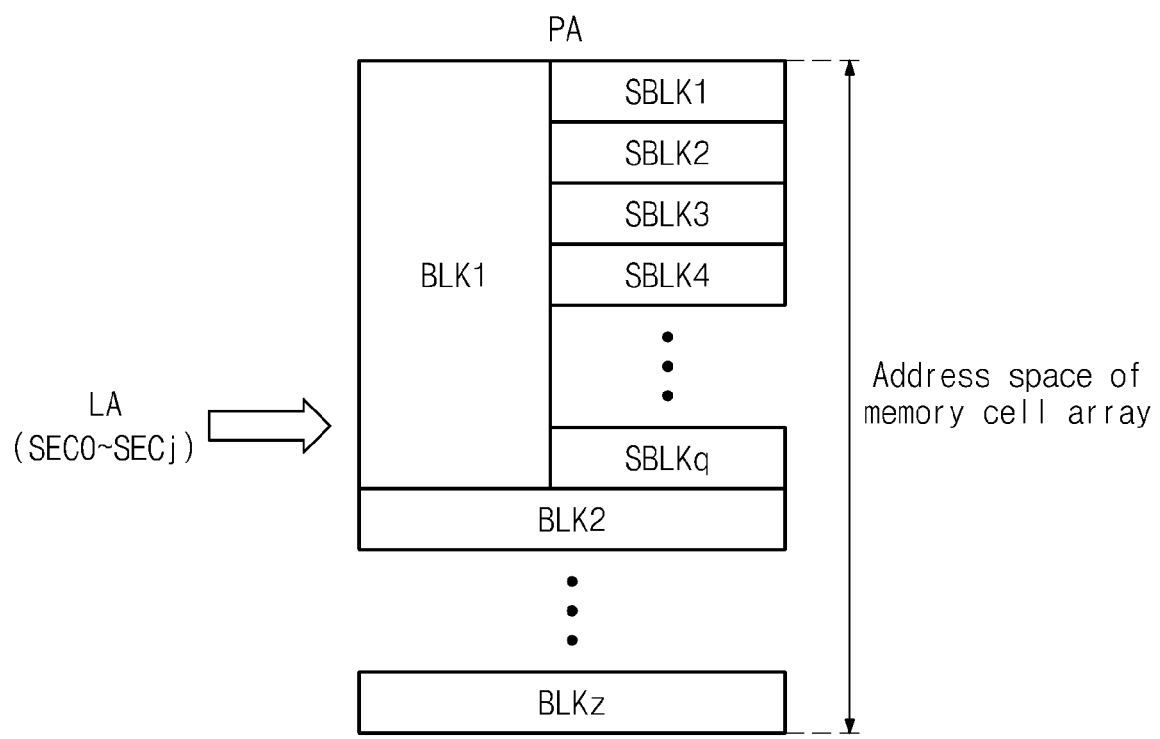
FIG. 21 is a diagram for describing a mapping relationship between physical addresses and logical addresses according to example embodiments of inventive concepts.

FIG. 21 is a diagram for describing a mapping relationship between physical addresses and logical addresses according to example embodiments of inventive concepts. Referring to FIG. 21, a controller 200 may receive a first sector SEC0 to a jth sector SECj as a logical address LA from a host. Below, FIG. 21 is described under the assumption that a memory block BLK1 includes a sub-memory block judged to be a bad area.

According to example embodiments of inventive concepts, in the memory block BLK1, an address management circuit 211 converts a logical address LA to generate a physical address PA by a unit of a sub-memory block. This is referred to as sub block mapping. The address management circuit 211 does not generate a physical address PA corresponding to a sub-memory block of the memory block BLK1 judged to be a bad area. Remaining memory blocks of the memory block BLK1 other than the bad area may be used.

In case of memory blocks BLK2 to BLKz not including a bad area, the address management circuit 211 performs block mapping. That is, the address management circuit 211 provides a physical address PA by a sub-memory block unit when a memory block including a bad area is selected. The address management circuit 211 provides a physical address PA by a memory block unit when a memory block not including a bad area is selected.

Figure 22:
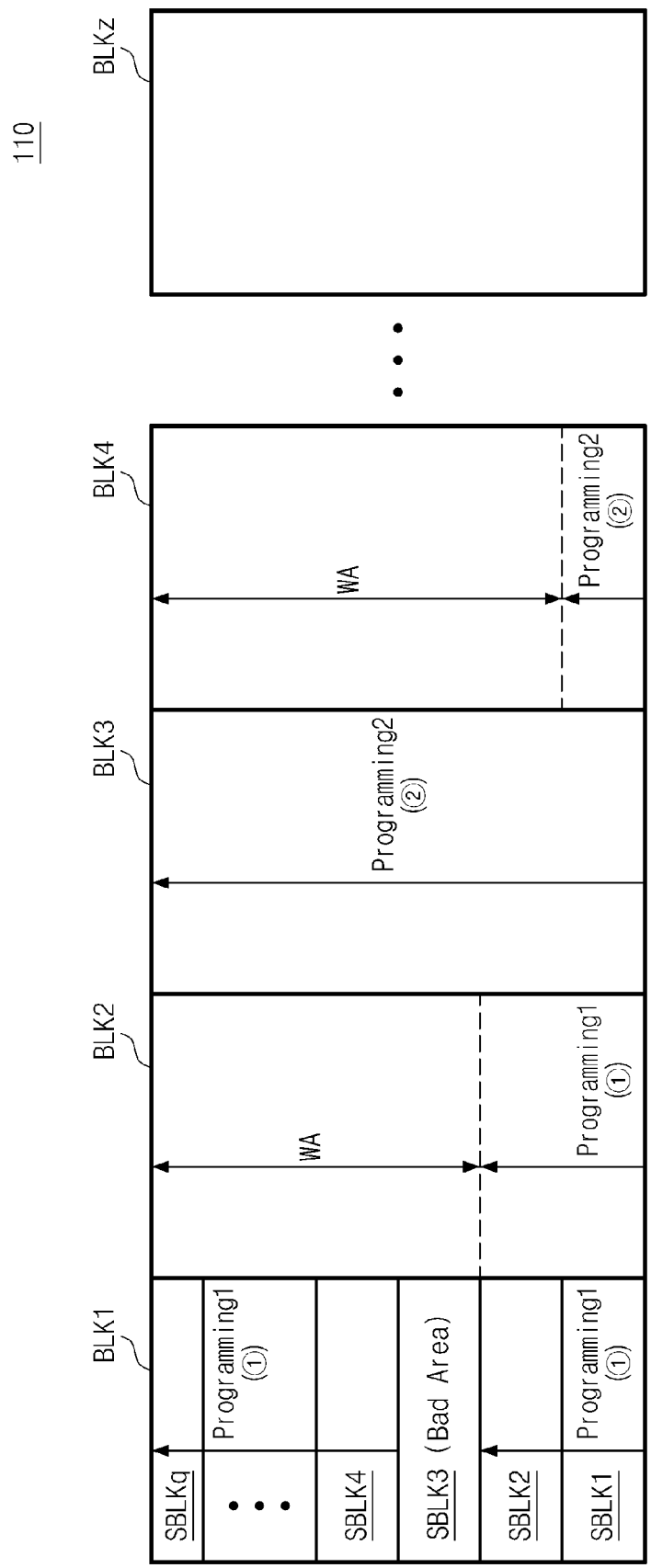
FIG. 22 is a diagram for describing a method of storing data in a first memory block including a bad area according to a mapping relationship described in FIG. 21, according to example embodiments.

FIG. 22 is a diagram for describing a method of storing data in a first memory block including a bad area according to a mapping relationship described in FIG. 21. It is assumed that a controller 200 sequentially receives data for first programming (①) and data for second programming (②) from a host. Further, it is assumed that a third sub-memory block SBLK3 of a first memory block BLK1 is a bad area.

Referring to FIGS. 1, 21, and 22, the controller 200 may receive a logical address LA from the host together with the data for the first programming (①). An address management circuit 211 may generate physical addresses PA corresponding to sub-memory blocks SBLK1, SBLK2, and SBLK4 to SBLKq of the first memory block BLK1 and a second memory block BLK2, based upon the logical address LA. The address management circuit 211 further generates offset information being information about addresses of pages to be programmed in the second memory block BLK2. According to the physical addresses PA, a program operation may be performed with respect to remaining sub-memory blocks SBLK1, SBLK2, and SBLK4 to SBLKq of the first memory block BLK1 other than the third sub-memory block SBLK3 and the second memory block BLK2. The address management circuit 211 stores the logical address LA, the physical address PA, and the mapping relationship between the logical address LA and the physical address PA in an address management register 212. Further, the logical address LA, the physical address PA, and the mapping relationship between the logical address LA and the physical address PA may be stored in a nonvolatile memory portion 110. That a physical address PA is stored in the address management register 212 means that data is previously stored in an area corresponding to the stored physical address PA.

The controller 200 receives data and a logical address LA for the second programming (②). The address management circuit 211 does not generate physical addresses PA corresponding to sub-memory blocks of the first memory block BLK1 and the second memory block BLK2, based upon physical addresses PA stored in the address management register 212.

The address management circuit 211 generates physical addresses PA corresponding to third and fourth memory blocks BLK3 and BLK4 based upon a logical address LA. The third and fourth memory blocks BLK3 and BLK4 are programmed according to the physical addresses PA. As understood from the description of FIG. 22, a wasted area WA exists within memory blocks in which data is stored.

Figure 23:
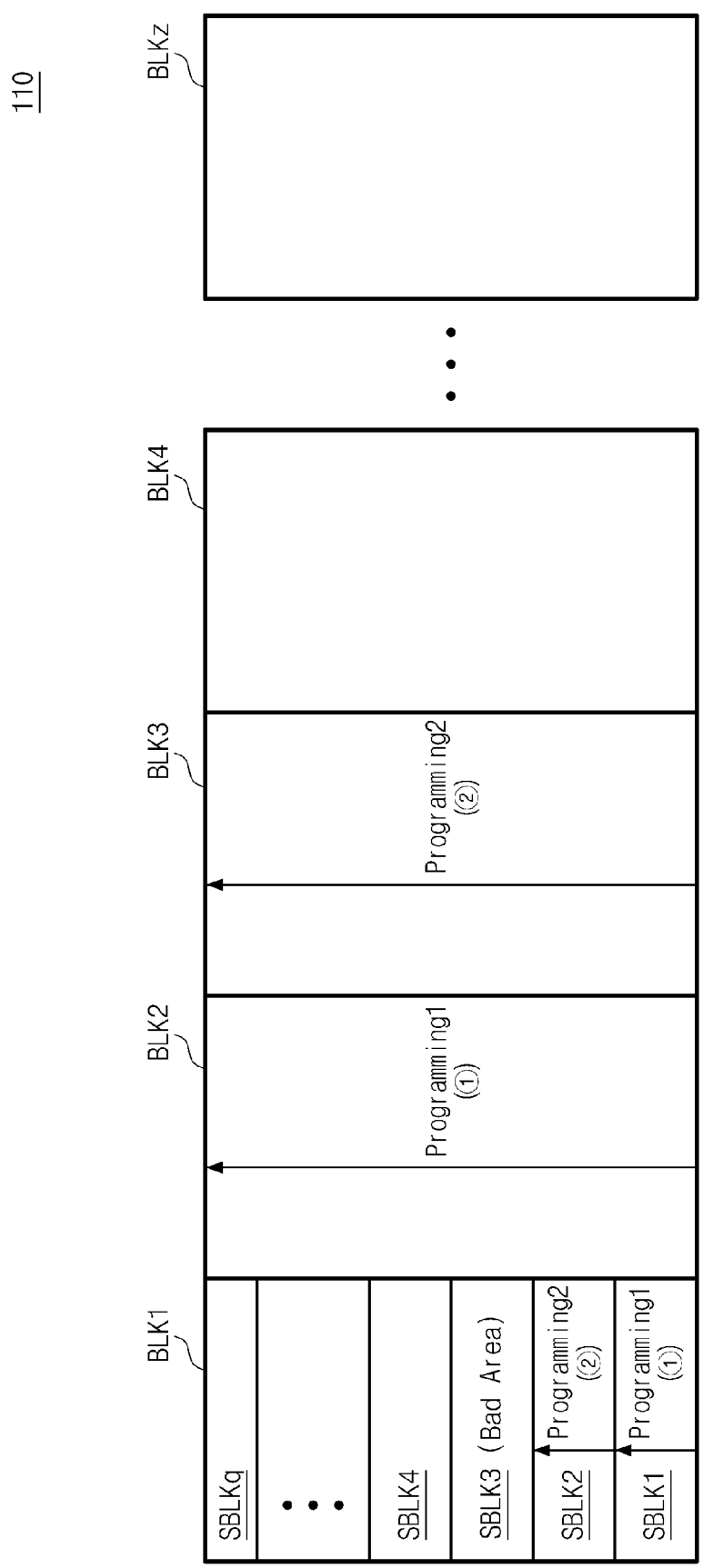
FIG. 23 is a diagram for describing a method of storing data in a first memory block including a bad area according to a mapping relationship described in FIG. 21, according to example embodiments.

FIG. 23 is a diagram for describing a method according to example embodiments of storing data in a first memory block including a bad area according to a mapping relationship described in FIG. 21. Referring to FIG. 23, a first memory block BLK1 including a bad area is used as a log memory block. The term "log memory block" is used to call a memory block in which data is partially stored. Alternatively, in the event that data in a first memory block is stored in a second memory block according to a copy-back operation, the term "log memory block" is used to call the first memory block.

It is assumed that an amount of data to be programmed is more than that of data capable of being stored in one memory block and less than that of data capable of being stored in two memory blocks. In this case, all memory cells of the second memory block BLK2 are programmed, and a part of memory cells of the first memory block BLK1 is programmed. At this time, the first memory block BLK1 is called a log memory block.

Data for the first programming (①) and data for the second programming (②) are sequentially received from a host. It is assumed that an amount of data for each of the first programming and the second programming is more than that of data capable of being stored in one memory block and less than that of data capable of being stored in two memory blocks.

According to example embodiments of inventive concepts, the first memory block BLK1 including a bad area is used as a log memory block. The data for the first programming (①) is stored in the whole second memory block BLK2 and a first sub-memory block SBLK1 of the first memory block BLK1. The data for the second programming (②) is stored in the whole third memory block BLK3 and a second sub-memory block SBLK2 of the first memory block BLK1. Accordingly, it is possible to reduce a wasted area WA which exists within memory blocks in which data is stored.

Figure 24:
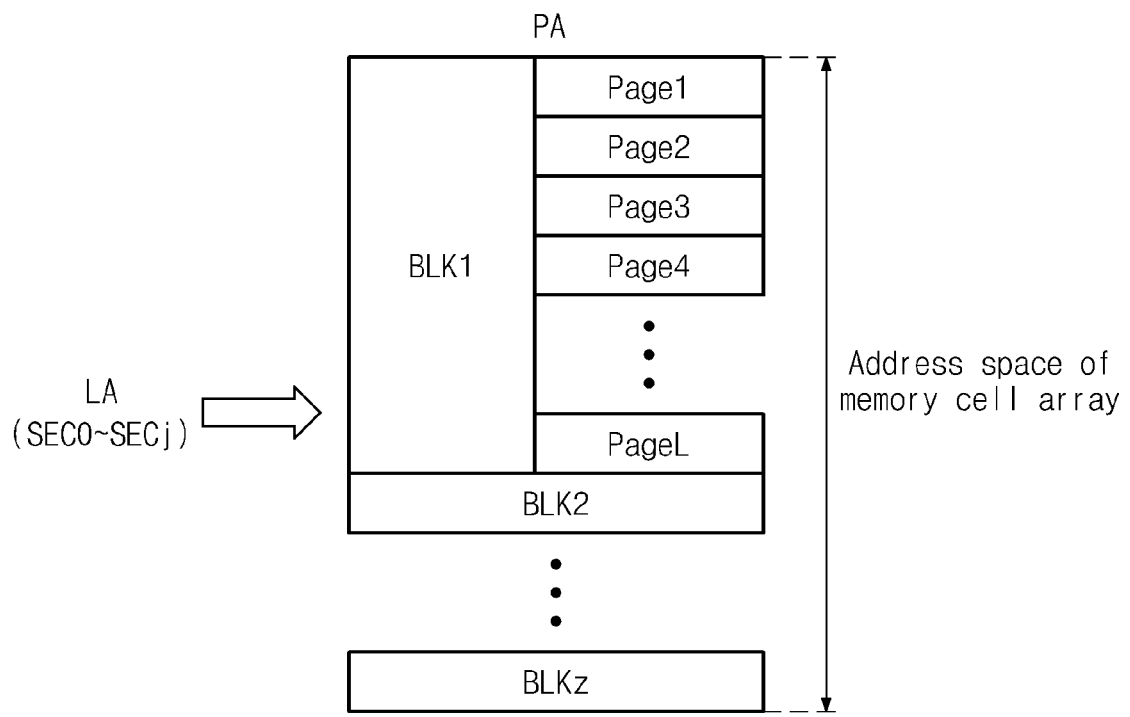
FIG. 24 is a diagram for describing a mapping relationship between physical addresses and logical addresses according to example embodiments of inventive concepts.

FIG. 24 is a diagram for describing a mapping relationship between physical addresses and logical addresses according to example embodiments of inventive concepts. It is assumed that a first memory block BLK1 includes a memory layer judged to be a bad area.

In the first memory block BLK1, an address management circuit 211 performs page mapping. At this time, the address management circuit 211 does not generate a physical address PA corresponding to a page judged to be a bad area. That is, the address management circuit 211 generates physical addresses PA corresponding to remaining pages of the first memory block BLK1 other than the bad area. In case of remaining memory blocks BLK2 to BLKz not including a bad area, the address management circuit 211 performs page mapping, sub block mapping, or block mapping. In FIG. 24, there is shown a mapping relationship between logical addresses and physical addresses when the block mapping is performed with respect to the memory blocks BLK2 to BLKz.

The address management circuit 211 provides a physical address PA by a page unit when a memory block including a bad area is selected. The address management circuit 211 provides a physical address PA by a memory block unit when a memory block not including a bad area is selected.

Figure 25:
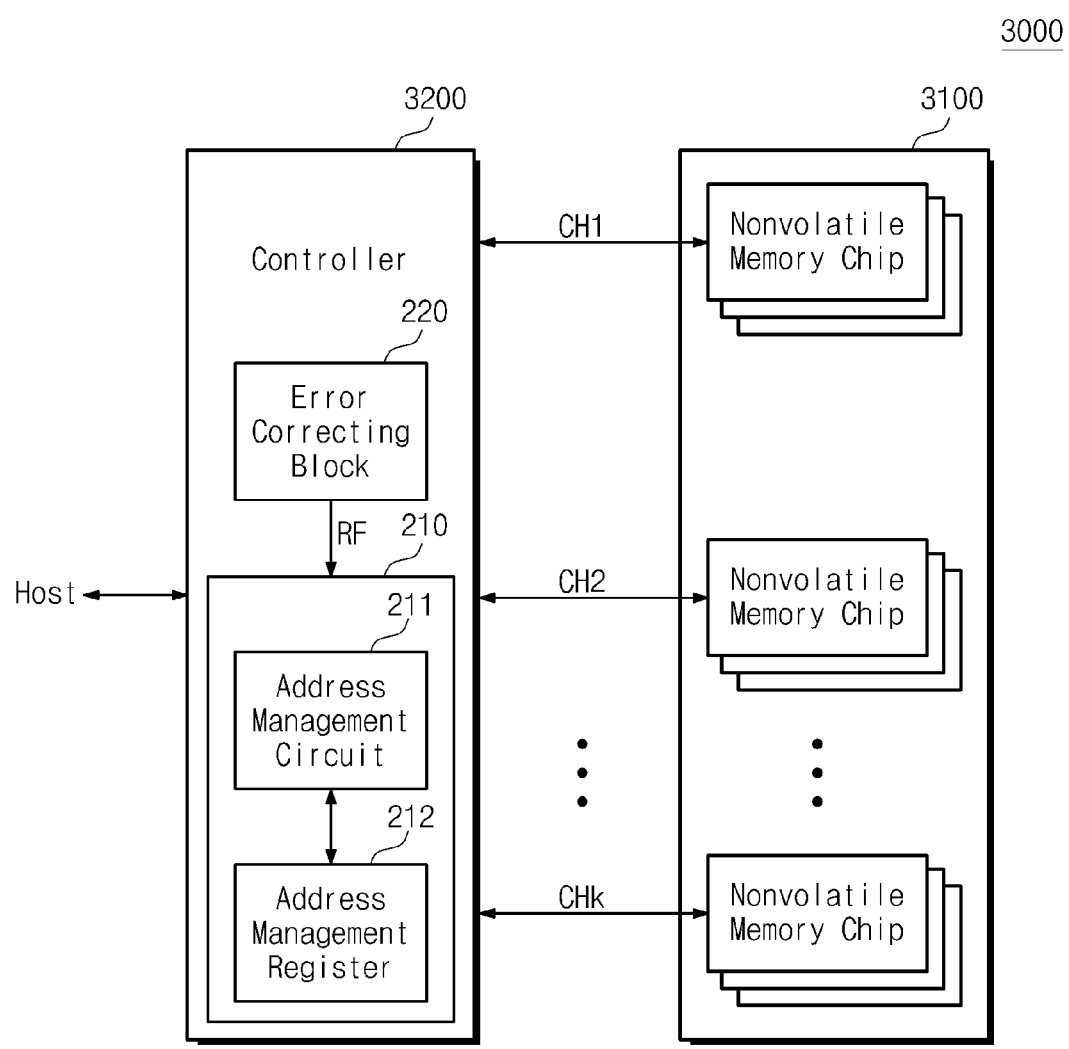
FIG. 25 is a block diagram illustrating an application of a nonvolatile memory device in FIG. 1.

FIG. 25 is a block diagram illustrating an application of a nonvolatile memory device in FIG. 1.

Referring to FIG. 25, a nonvolatile memory device 3000 includes a nonvolatile memory portion 3100 and a controller 3200. The nonvolatile memory portion 3100 includes a plurality of nonvolatile memory chips. The plurality of nonvolatile memory chips may be classified into a plurality of groups. Nonvolatile memory chips in each group may communicate with the controller 3200 via a common channel.

Each nonvolatile memory chip is substantially identical to a nonvolatile memory portion 100 in FIG. 1. Each nonvolatile memory chip includes a plurality of memory blocks. Each memory block may include a plurality of memory layers stacked on a substrate 111. Each memory layer may include a plurality of memory cells arranged in a direction parallel with the substrate 111.

The controller 3200 operates the same as that described with reference to FIG. 1. That is, the controller 3200 includes an error correcting block 220 and a flash translation layer (FTL) 210 configured to translate a logical address into a physical address. The FTL 210 may be configured to manage a bad area of each nonvolatile memory chip by a memory layer unit or a sub-memory block unit. The controller 3200 provides addresses to nonvolatile memory chips according to a physical address provided by the FTL 210.

FIG. 25 illustrates the case where a plurality of nonvolatile memory chips are connected with one channel. However, the nonvolatile memory device 3000 can be modified such that one nonvolatile memory chip is connected with one channel.

Figure 26:
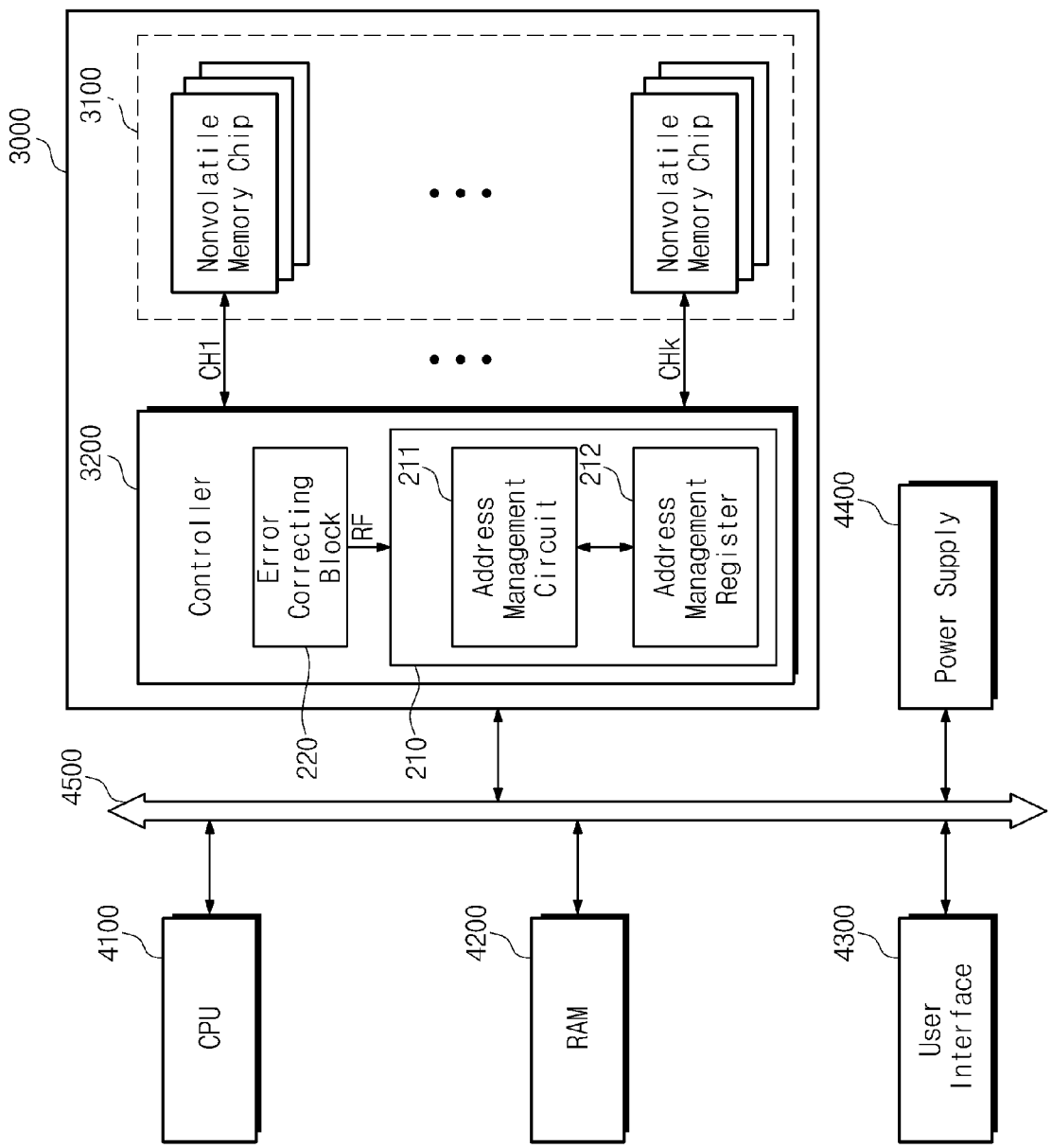
FIG. 26 is a block diagram illustrating a computing system including a nonvolatile memory device in FIG. 25.

FIG. 26 is a block diagram illustrating a computing system including a nonvolatile memory device in FIG. 25. Referring to FIG. 26, a computing system 4000 includes a CPU 4100, a RAM 4200, a user interface 4300, a power supply 4400, a system bus 4500, and a nonvolatile memory device 3000.

The nonvolatile memory device 3000 is electrically connected with the CPU 4100, the RAM 4200, the user interface 4300, and the power supply 4400 via the system bus 4500. Data provided via the user interface 4300 or processed by the CPU 4100 is stored in the nonvolatile memory device 3000.

FIG. 26 illustrates the case where a nonvolatile memory portion 3100 is connected with the system bus 4500 via a controller 3200. However, example embodiments are not limited thereto and the nonvolatile memory portion 3100 can be connected directly to the system bus 4500. In this case, a function of the controller 3200 may be executed by the CPU 4100. Further, the CPU 4100 may include a flash translation layer 210 described in FIG. 1.

In FIG. 26, the nonvolatile memory device 3000 described with reference to FIG. 25 can be replaced with a nonvolatile memory device 1000 described with reference to FIG. 1.

In this embodiment, the computing system 4000 may be configured to include all of nonvolatile memory devices 1000 and 3000 described in FIGS. 1 and 25.

According to example embodiments of inventive concepts, a controller 200 judges whether an accessed memory block includes a bad memory cell, based upon a fail signal FS or a fail address FAD. If a bad memory cell is detected, an address management circuit 211 updates bad area information stored in an address management register 212 such that at least one memory layer of the accessed memory block is treated as a bad area. At this time, the controller 200 stores the updated bad area information in a nonvolatile memory portion 100.

According to example embodiments, if a bad memory cell is detected, the address management circuit 211 updates bad area information stored in the address management register 212 such that at least one sub-memory block of the accessed memory block is treated as a bad area. It is possible to manage a bad area by the memory layer or the sub-memory block, not the memory block. When a bad memory cell is detected, not the whole accessed memory block but a part of the accessed memory block may be treated as a bad area. Accordingly, the number of unused memory cells is reduced by managing a bad area.

While some example embodiments have been particularly shown and described, it will be understood by one of ordinary skill in the art that variations in form and detail may be made therein without departing from the spirit and scope of the claims.

What is claimed is:

1. A bad area managing method comprising:
    accessing one of a plurality of memory blocks on a substrate in a nonvolatile memory device, each one of the memory blocks containing memory layers stacked on top of each other on the substrate;
    judging whether at least one memory layer of the memory layers in the accessed memory block includes a bad memory cell; and
    if a bad memory cell is detected in the at least one memory layer, configuring the memory device to treat the at least one memory layer of the accessed memory block as a bad area.

2. The bad area managing method of claim 1, wherein the configuring the memory device to treat the at least one memory layer of the accessed memory block as a bad area comprises:
    treating a lower one of the memory layers that is between the at least one memory layer containing the bad memory cell and the substrate, together with the at least one memory layer containing the bad memory cell, as a bad area.

3. The bad area managing method of claim 1, wherein the configuring the memory device to treat the at least one memory layer of the accessed memory block as a bad area comprises:
   treating all memory layers between the at least one memory layer containing the bad memory cell and the substrate, together with the at least one memory layer containing the bad memory cell, as a bad area.

4. The bad area managing method of claim 1, wherein
   each memory layer includes a plurality of memory cells,
   each memory block includes a semiconductor pillar that penetrates the memory layers of the memory block, and
   the semiconductor pillar of each memory block defines channels of the plurality of memory cells contained within the memory block.

5. The bad area managing method of claim 4,
   wherein the configuring the memory device to treat the at least one memory layer of the accessed memory block as a bad area comprises treating another memory layer other than the at least one memory layer containing the bad memory cell, together with the at least one memory layer containing the bad memory cell, as a bad area; and
   wherein the semiconductor pillar includes a first width that is wider than a second width of the semiconductor pillar,
   the first width corresponding to the at least one memory layer containing the bad memory cell, and
   the second width corresponding to the another memory layer.

6. The bad area managing method of claim 1, wherein
   the plurality of memory layers in each memory block are divided into a plurality of sub memory blocks, and
   the configuring the memory device to treat the at least one memory layer of the accessed memory block as a bad area includes,
   treating at least one sub-memory block of the accessed memory block as a bad area,
      the at least one sub-memory block containing the bad memory cell.

7. The bad area managing method of claim 6,
   wherein the configuring the memory device to treat the at least one memory layer of the accessed memory block as a bad area comprises treating another sub-memory block other than the sub-memory block containing the bad memory cell, together with the sub-memory block including the bad memory cell, as a bad area;
   wherein each sub-memory block includes a semiconductor pillar that penetrates the memory layers of the sub-memory block; and
   wherein the semiconductor pillar includes a first width that is wider than a second width of the semiconductor pillar,
   the first width corresponding to the sub-memory block containing the bad memory cell and the second width corresponding to the another sub-memory block.

8. The bad area managing method of claim 1,
   wherein each memory block includes a plurality of memory cells and a semiconductor pillar, the semiconductor pillar penetrating the memory layers of the memory block;
   wherein the semiconductor pillar of each memory block defines channels of memory cells contained within the memory block;
   wherein the semiconductor pillar includes first and second sub semiconductor pillars that are perpendicular to the substrate and the first sub semiconductor pillar penetrates the at least one memory layer including the bad memory cell;
   wherein a first width of the first sub semiconductor pillar is wider than a second width of the first sub semiconductor pillar;
   wherein the first width corresponds to the at least one sub-memory layer including the bad memory cell and the second width corresponds to the at least one sub-memory layer
   wherein the configuring the memory device to treat the at least one memory layer of the accessed memory block as a bad area comprises,
      treating another memory layer penetrated by the first sub semiconductor pillar, together with the at least one memory layer containing the bad memory cell, as a bad area.

9. The bad area managing method of claim 1, wherein,
   if a bad memory cell is detected in the at least one memory layer, the configuring the memory device further includes treating a portion of the accessed memory block as a normal area, and
   the portion of the accessed memory block includes other ones of the memory layers in the accessed block that are separate from the at least one memory layer treated as a bad area.

10. A nonvolatile memory device comprising:
    a nonvolatile memory portion including a plurality of memory blocks,
       each of the plurality of memory blocks containing memory layers stacked on a substrate; and
    a controller configured to manage at least one memory layer of an accessed one of the plurality of memory blocks as a bad area when the memory device detects a bad memory cell in the at least one memory layer of the accessed memory block.

11. The nonvolatile memory device of claim 10, wherein the controller comprises:
    an address management register configured to store bad area information about the bad area; and
    an address management circuit configured to update the bad area information such that the at least one memory layer including the bad memory cell is managed as the bad area.

12. The nonvolatile memory device of claim 11,
    wherein the address management circuit is configured to provide a physical address based upon the bad area information, the nonvolatile memory portion being accessed according to the physical address,
    wherein, at a program or read operation, the address management circuit is configured to provide the physical address by a page unit when the memory block including the bad area is selected and by a memory block unit when another memory block not including the bad area is selected.

13. The nonvolatile memory device of claim 10, wherein memory layers included in each memory block are divided into a plurality of sub-memory blocks stacked on the substrate, and
    wherein the controller comprises,
    an address management register configured to store bad area information about the bad area; and
    an address management circuit configured to update the bad area information such that the at least one sub-memory block including the bad memory cell is managed as the bad area.

14. The nonvolatile memory device of claim 13,
wherein the address management circuit is configured to provide a physical address based upon the bad area information,
wherein the nonvolatile memory portion is configured to accessed according to the physical address, and
wherein at a program or read operation, the address management circuit is configured to provide the physical address of a sub-memory block unit when a memory block including the bad area is selected and the physical address of a memory block unit when a memory block not including the bad area is selected.

15. The nonvolatile memory device of claim 10,
wherein the controller is configured to treat another memory layer other than a memory layer including the bad memory cell, together with the memory layer including the bad memory cell, as a bad area;
wherein each memory layer includes a plurality of memory cells;
wherein each memory block includes a semiconductor pillar that penetrates the memory layers of the memory block;
wherein the semiconductor pillar of each memory block defines channels of the plurality of memory cells contained within the memory block;
wherein the semiconductor pillar includes a first width that is wider than a second width of the semiconductor pillar; and
wherein the first width corresponds to the at least memory layer including the bad memory cell and the second width corresponds to the another memory layer.

16. The nonvolatile memory device of claim 10, wherein
the controller is configured to manage a portion of the accessed one of the plurality of memory blocks as a normal area when the memory device detects a bad memory cell in the at least one memory layer of the accessed memory block, and
the portion of the accessed memory block includes other ones of the memory layers in the accessed block that are separate from the at least one memory layer of the accessed memory block that includes a bad memory cell.

17. A nonvolatile memory device comprising:
a nonvolatile memory portion including a plurality of memory blocks on a substrate,
   each memory block including a plurality of memory layers stacked on top of each other,
   each memory layer containing a plurality of cell transistors;
a controller configured to manage at least one of the memory layers in a first part of one of the memory blocks as a bad area and to treat the memory layers in a second part of the one of the memory blocks as a normal area if the memory device detects a bad cell transistor in the first part of the one of the plurality of memory blocks and does not detect a bad cell transistor in the second part of the one of the plurality of memory blocks.

18. The nonvolatile memory device of claim 17, wherein
the controller is configured to detect a bad cell transistor in the nonvolatile memory portion in response to receiving at least one of a read fail signal, a program fail signal, and an erase fail signal when at least one of the plurality of memory blocks is accessed by the controller.

19. The nonvolatile memory device of claim 17, wherein
each memory block includes a plurality of sub-memory blocks,
each sub-memory block contains at least two of the memory layers in the memory block, and
the controller is configured to manage the at least one of the memory layers in the first part of the one of the memory blocks as a bad area during a first programming operation by,
   storing data of the first programming operation in a first-sub memory block of a first memory block, and
   storing data of the first programming operation in at least one other memory block when the memory device detects the first memory block includes another sub-memory block containing a bad cell transistor and the other memory block does not contain a bad cell transistor.

20. A computing system comprising:
a CPU connected via a system bus to the nonvolatile memory device according of claim 17.

* * * * *